United States Patent
Tsukamoto

(10) Patent No.: US 11,528,047 B2
(45) Date of Patent: Dec. 13, 2022

(54) MULTILAYER SUBSTRATE, LOW-PASS FILTER, HIGH-PASS FILTER, MULTIPLEXER, RADIO-FREQUENCY FRONT-END CIRCUIT, AND COMMUNICATION DEVICE

(71) Applicant: Murata Manufacturing Co., Ltd., Kyoto (JP)

(72) Inventor: Hideki Tsukamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 142 days.

(21) Appl. No.: 16/996,278

(22) Filed: Aug. 18, 2020

(65) Prior Publication Data
US 2020/0382152 A1 Dec. 3, 2020

Related U.S. Application Data

(63) Continuation of application No. PCT/JP2019/005867, filed on Feb. 18, 2019.

(30) Foreign Application Priority Data

Feb. 19, 2018 (JP) .............................. JP2018-027443

(51) Int. Cl.
*H05K 3/46* (2006.01)
*H04B 1/40* (2015.01)
(Continued)

(52) U.S. Cl.
CPC .............. *H04B 1/40* (2013.01); *H03H 7/0138* (2013.01); *H03H 7/461* (2013.01); *H05K 3/46* (2013.01)

(58) Field of Classification Search
CPC ........ H04B 1/40; H03H 7/0138; H03H 7/461; H05K 3/46
See application file for complete search history.

(56) References Cited

U.S. PATENT DOCUMENTS

| | | |
|---|---|---|
| 6,111,478 A | 8/2000 | Furutani et al. |
| 2002/0180561 A1 | 12/2002 | Kawahara et al. |

(Continued)

FOREIGN PATENT DOCUMENTS

| | | |
|---|---|---|
| JP | H11-112264 A | 4/1999 |
| JP | 2002-016467 A | 1/2002 |

(Continued)

OTHER PUBLICATIONS

International Search Report for International Application No. PCT/JP2019/005867 dated May 7, 2019.

(Continued)

*Primary Examiner* — Dinh T Le
(74) *Attorney, Agent, or Firm* — Pearne & Gordon LLP

(57) ABSTRACT

A multilayer substrate includes a pair of first capacitor electrodes, a pair of second capacitor electrodes, and a dielectric substrate. Electrodes of the pair of first capacitor electrodes are disposed in dielectric substrate so as to face each other in a thickness direction of the dielectric substrate. Electrodes of the pair of second capacitor electrodes are disposed in the dielectric substrate so as to face each other in the thickness direction. A first element and a second element that are disposed in or on the dielectric substrate, and the pair of second capacitor electrodes, the pair of first capacitor electrodes, and a ground electrode that are disposed in the dielectric substrate are arranged in the stated order in the thickness direction. The pair of second capacitor electrodes at least partially overlaps the pair of first capacitor electrodes when viewed in plan in the thickness direction.

11 Claims, 18 Drawing Sheets

(51) Int. Cl.
   *H03H 7/01*     (2006.01)
   *H03H 7/46*     (2006.01)

(56)  References Cited

U.S. PATENT DOCUMENTS

| | | |
|---|---|---|
| 2004/0217915 A1 | 11/2004 | Imaizumi |
| 2009/0033439 A1* | 2/2009 | Igarashi ............... H03H 7/0115 333/185 |
| 2010/0291946 A1 | 11/2010 | Yamakawa et al. |
| 2018/0069524 A1 | 3/2018 | Ishizuka |

FOREIGN PATENT DOCUMENTS

| | | |
|---|---|---|
| JP | 2003-046358 A | 2/2003 |
| JP | 2004-336250 A | 11/2004 |
| JP | 2007-123993 A | 5/2007 |
| WO | 2009/072251 A1 | 6/2009 |
| WO | 2015/059963 A1 | 4/2015 |
| WO | 2017/002661 A1 | 1/2017 |

OTHER PUBLICATIONS

Written Opinion for International Application No. PCT/JP2019/005867 dated May 7, 2019.

* cited by examiner

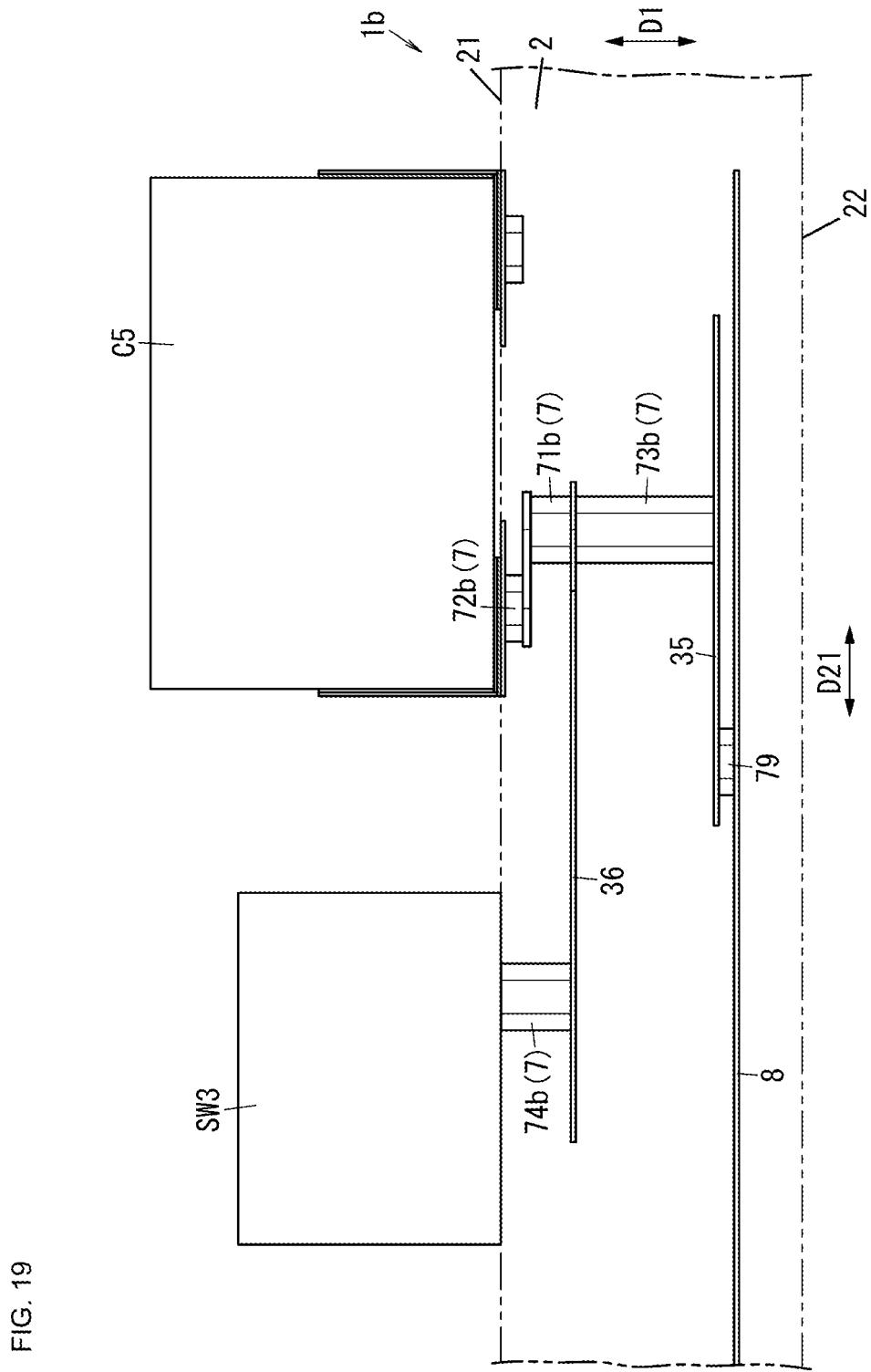

us 11,528,047 B2

MULTILAYER SUBSTRATE, LOW-PASS FILTER, HIGH-PASS FILTER, MULTIPLEXER, RADIO-FREQUENCY FRONT-END CIRCUIT, AND COMMUNICATION DEVICE

This is a continuation of International Application No. PCT/JP2019/005867 filed on Feb. 18, 2019 which claims priority from Japanese Patent Application No. 2018-027443 filed on Feb. 19, 2018. The contents of these applications are incorporated herein by reference in their entireties.

BACKGROUND OF THE DISCLOSURE

Field of the Disclosure

The present disclosure generally relates to a multilayer substrate, a low-pass filter, a high-pass filter, a multiplexer, a radio-frequency front-end circuit, and a communication device and, more specifically, to a multilayer substrate including a capacitor and to a low-pass filter, a high-pass filter, a multiplexer, a radio-frequency front-end circuit, and a communication device that include the multilayer substrate.

Description of the Related Art

A filter known in the art includes capacitors (see, for example, Patent Document 1). The filter described in Patent Document 1 includes series LC circuit sections, each of which includes a parallel inductor and a parallel capacitor connected in series. In each series LC circuit section, one end of a parallel inductor is connected to an input terminal, and the other end of the parallel inductor is connected to one end of the corresponding parallel capacitor. The other end of the parallel capacitor is grounded. A connection point between the parallel inductor and the parallel capacitor is connected with one end of a semiconductor switch via an additional parallel capacitor, which is also used to block a direct current signal. The other end of the semiconductor switch is grounded.

Patent Document 1: International Publication No. 2009/072251

BRIEF SUMMARY OF THE DISCLOSURE

When a parallel capacitor (a first capacitor) and an additional parallel capacitor (a second capacitor) of such a conventional series LC circuit section described in Patent Document 1 are disposed in a multilayer substrate, stray capacitance may arise between the additional parallel capacitor and the ground. As a result, desired characteristics (filter characteristics) may not be achieved.

It is an object of the present disclosure is to provide a multilayer substrate, a low-pass filter, a high-pass filter, a multiplexer, a radio-frequency front-end circuit, and a communication device that are capable of suppressing stray capacitance.

A multilayer substrate according to an aspect of the present disclosure includes an input/output electrode, a ground electrode, a pair of first capacitor electrodes, a pair of second capacitor electrodes, and a dielectric substrate. The input/output electrode is an electrode for input, an electrode for output, or an electrode for input and output. Electrodes of the pair of first capacitor electrodes constitute a first capacitor electrically connected between the input/output electrode and the ground electrode. Electrodes of the pair of second capacitor electrodes constitute a second capacitor connected parallel to the first capacitor. A first element in series with the first capacitor and a second element in series with the second capacitor are disposed in or on the dielectric substrate. The electrodes of the pair of first capacitor electrodes are disposed in the dielectric substrate so as to face each other in a thickness direction of the dielectric substrate. The electrodes of the pair of second capacitor electrodes are disposed in the dielectric substrate so as to face each other in the thickness direction. The first element and the second element that are disposed in or on the dielectric substrate, and the pair of second capacitor electrodes, the pair of first capacitor electrodes, and the ground electrode that are disposed in the dielectric substrate are arranged in the stated order in the thickness direction. The pair of second capacitor electrodes at least partially overlaps the pair of first capacitor electrodes when viewed in plan in the thickness direction.

A multilayer substrate according to another aspect of the present disclosure includes an input/output electrode, a ground electrode, a first inductor, a second inductor, and a dielectric substrate. The input/output electrode is an electrode for input, an electrode for output, or an electrode for input and output. The first inductor is electrically connected between the input/output electrode and the ground electrode. The second inductor is connected parallel to the first inductor. A first element in series with the first inductor and a second element in series with the second inductor are disposed in or on the dielectric substrate. The first inductor is disposed in the dielectric substrate. The second inductor is disposed in the dielectric substrate. The first element and the second element that are disposed in or on the dielectric substrate, and the second inductor, the first inductor, and the ground electrode that are disposed in the dielectric substrate are arranged in the stated order in a thickness direction of the dielectric substrate. The second inductor at least partially overlaps the first inductor when viewed in plan in the thickness direction.

A low-pass filter according to still another aspect of the present disclosure includes the multilayer substrate, a pass band of the low-pass filter being lower than or equal to a predetermined frequency.

A high-pass filter according to still another aspect of the present disclosure includes the multilayer substrate, a pass band of the high-pass filter being higher than or equal to a predetermined frequency.

A multiplexer according to still another aspect of the present disclosure includes the multilayer substrate. The multilayer substrate includes a plurality of the input/output electrodes and further includes a first series-arm capacitor and a second series-arm capacitor. The plurality of input/output electrodes include: an antenna-side terminal connected to an antenna; and a first terminal and a second terminal that are different from the antenna-side terminal. The first series-arm capacitor is disposed on a path forming a connection between the antenna-side terminal and the first terminal and is connected to the first terminal so as to be part of a first filter. The second series-arm capacitor is disposed on a path forming a connection between the antenna-side terminal and the second terminal and is connected to the second terminal so as to be part of a second filter.

The radio-frequency front-end circuit according to still another aspect of the present disclosure includes the multiplexer and an amplifier circuit connected to the multiplexer.

A communication device according to still another aspect of the present disclosure includes the radio-frequency front-end circuit and an RF signal processing circuit that processes radio-frequency signals received through the antenna. The radio-frequency front-end circuit transmits the radio-frequency signals between the antenna and the RF signal processing circuit.

The multilayer substrate, the low-pass filter, the high-pass filter, the multiplexer, the radio-frequency front-end circuit, and the communication device according to the aspects of the present disclosure can suppress stray capacitance.

BRIEF DESCRIPTION OF THE SEVERAL VIEWS OF THE DRAWINGS

FIG. 19 is a front view of a principal part of a multilayer substrate according to Embodiment 3 of the present disclosure.

DETAILED DESCRIPTION OF THE DISCLOSURE

The following describes multilayer substrates, low-pass filters, high-pass filters, multiplexers, radio-frequency front-end circuits, and communication devices according to Embodiments 1 to 3, with reference to the drawings. The drawings, which will be referred to in, for example, the following embodiments, are schematic views, in which constituent elements are not drawn to scale and the size and thickness ratios thereof may not fully correspond to the actual dimension ratios.

Embodiment 1

(1) Multilayer Substrate

The following describes the overall configuration of a multilayer substrate 1 according to Embodiment 1 with reference to the drawings.

Figure 1:
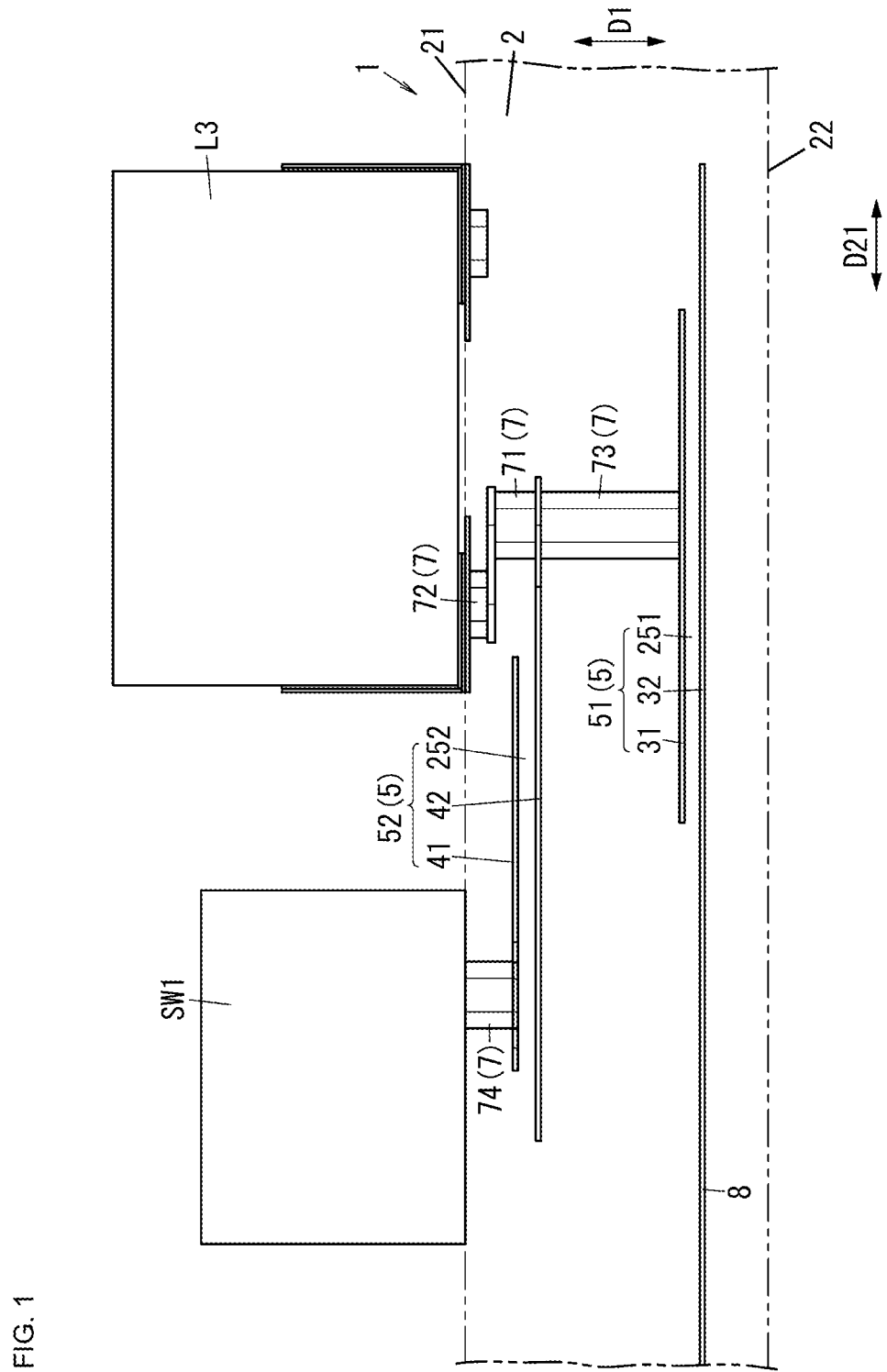
FIG. 1 is a front view of a first principal part of a multilayer substrate according to Embodiment 1 of the present disclosure.
Figure 2:
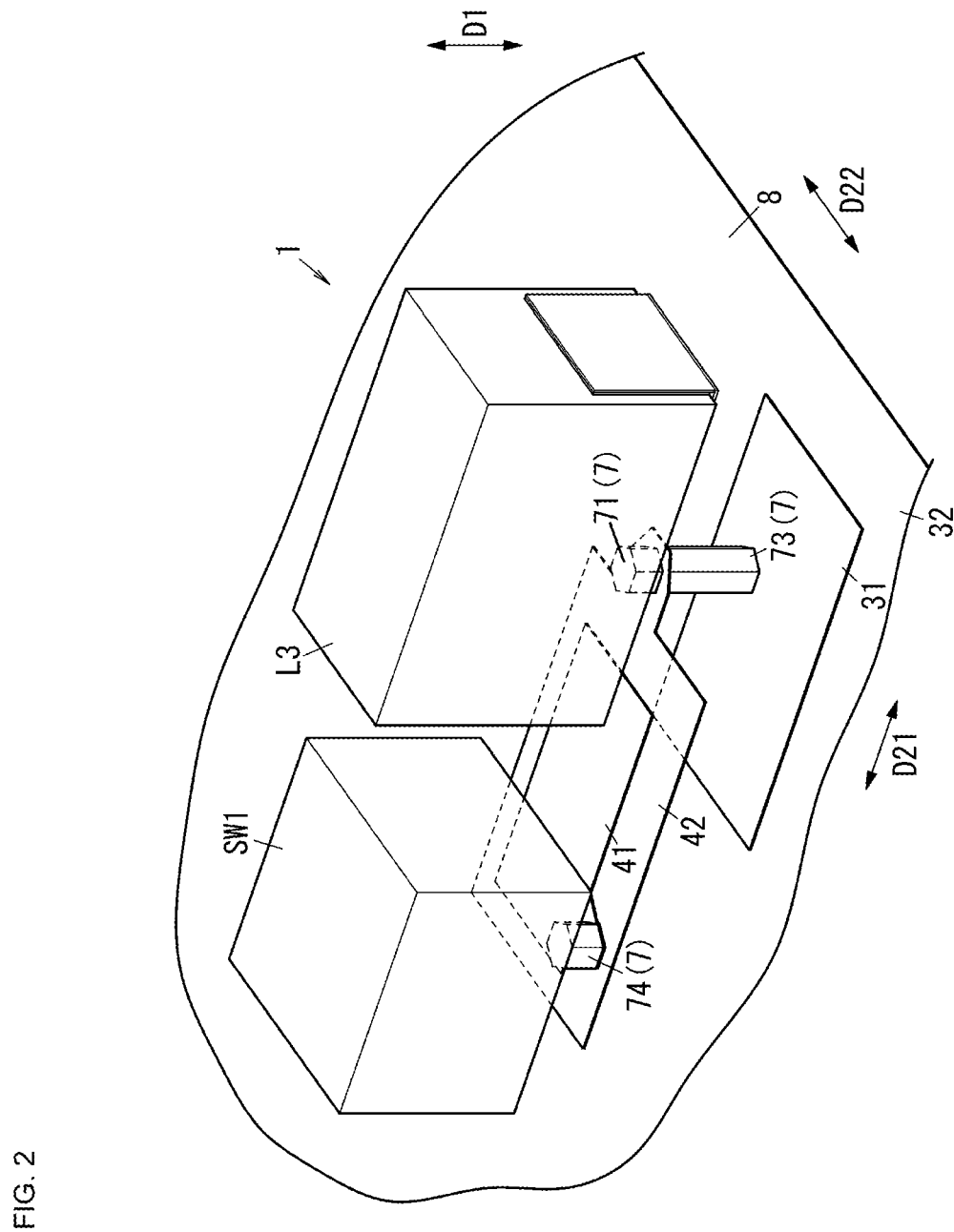
FIG. 2 is a perspective view of the first principal part of the multilayer substrate.
Figure 3:
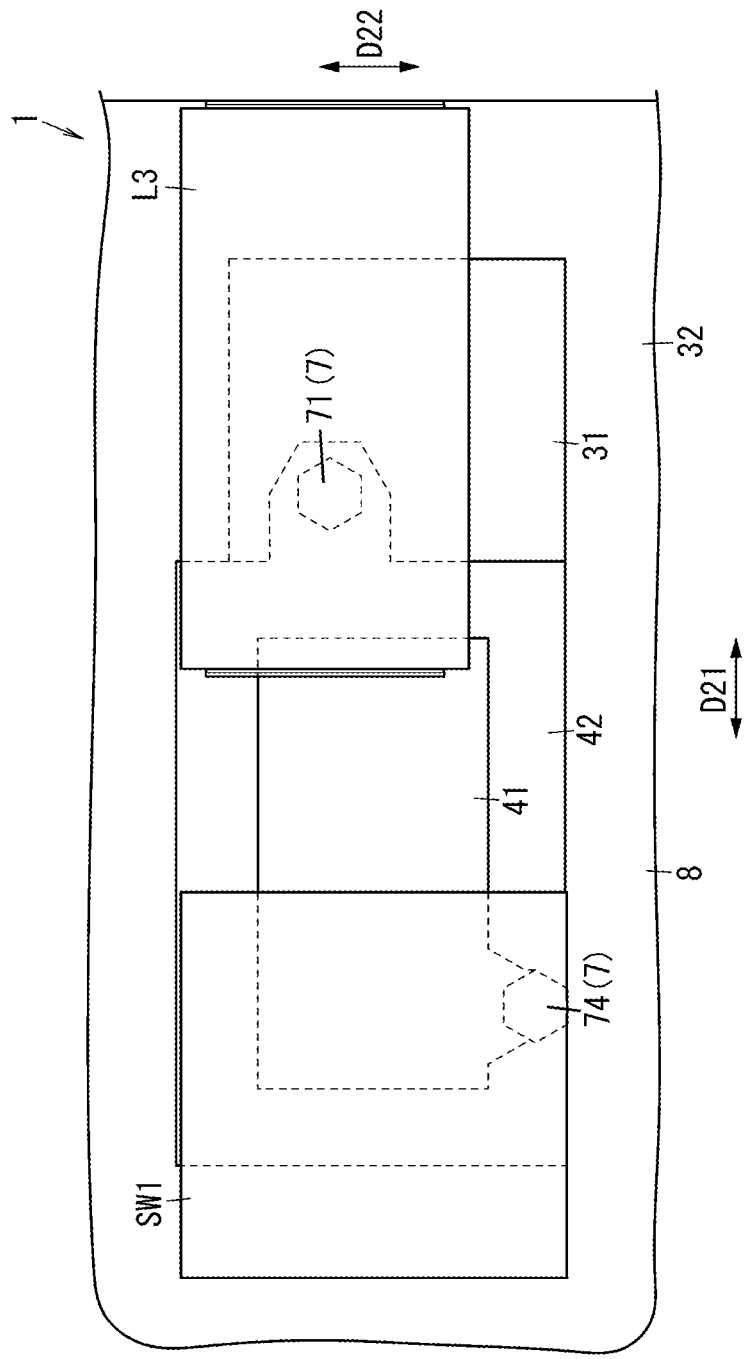
FIG. 3 is a plan view of the first principal part of the multilayer substrate.
Figure 4:
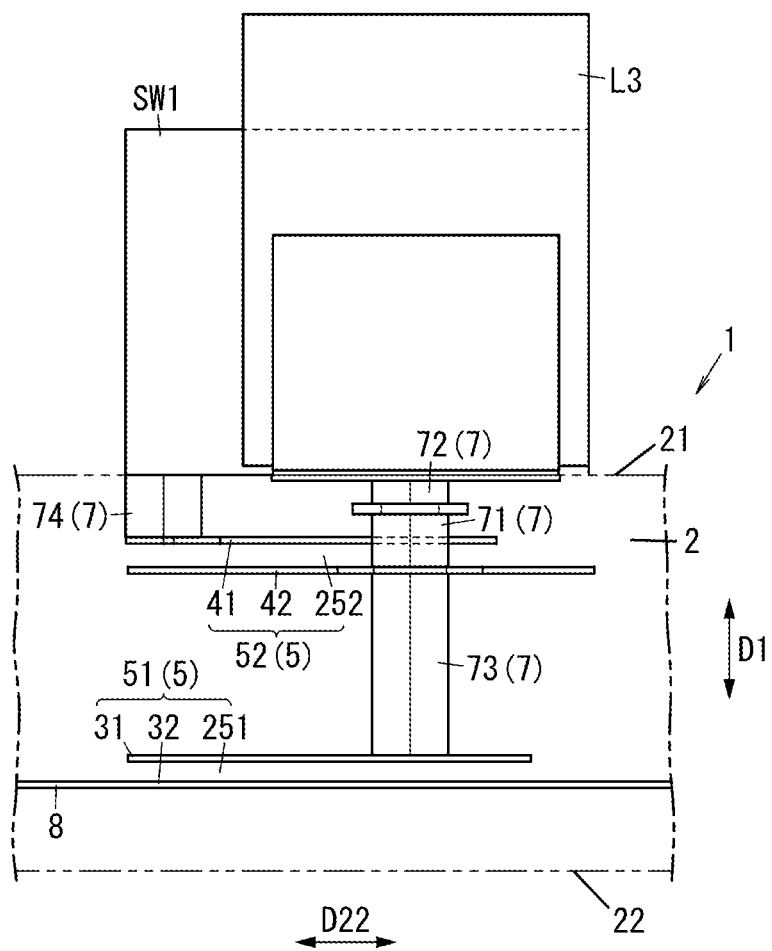
FIG. 4 is a right-hand side view of the first principal part of the multilayer substrate.
Figure 5:
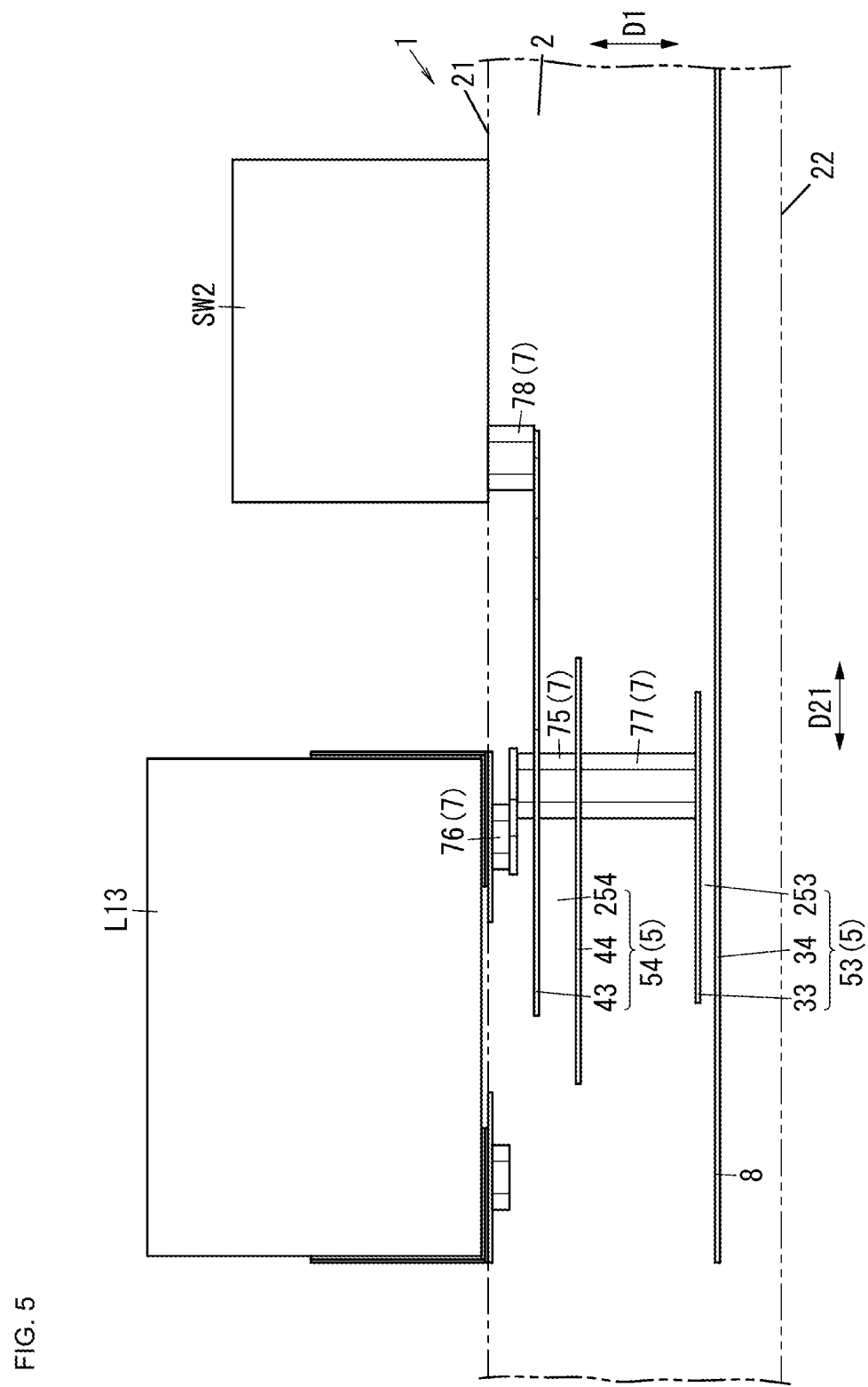
FIG. 5 is a front view of a second principal part of the multilayer substrate.
Figure 6:
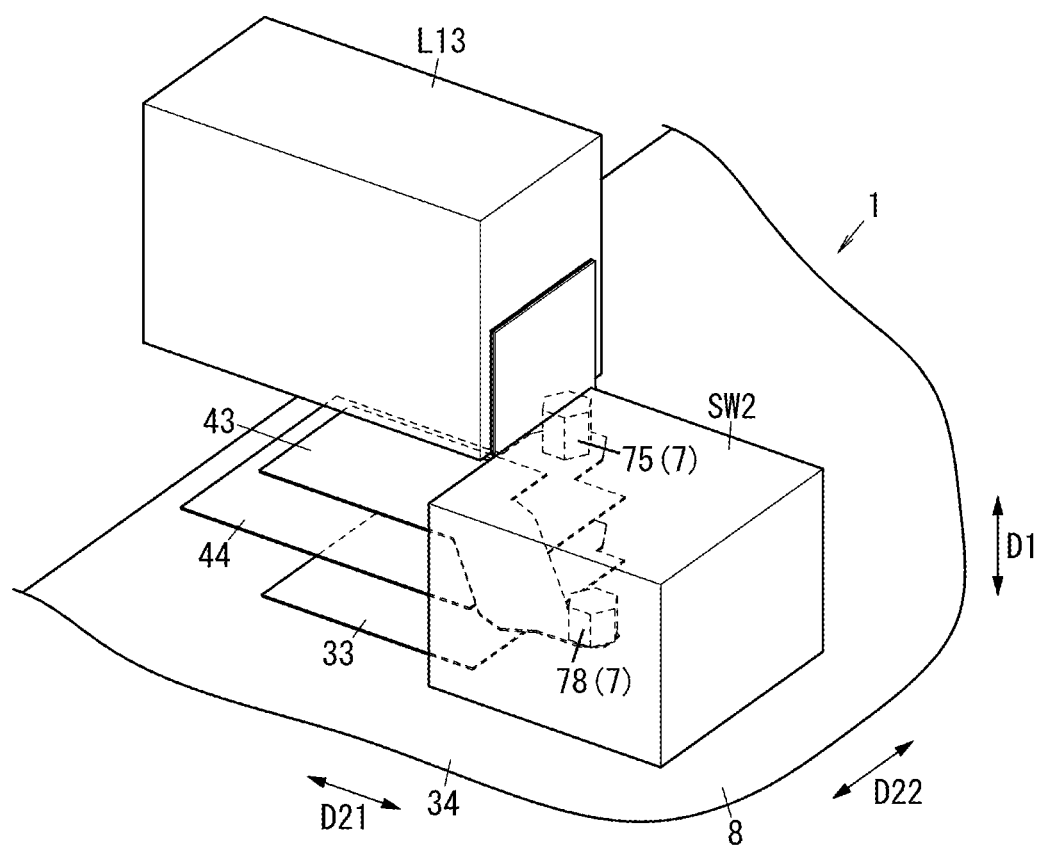
FIG. 6 is a perspective view of the second principal part of the multilayer substrate.
Figure 7:
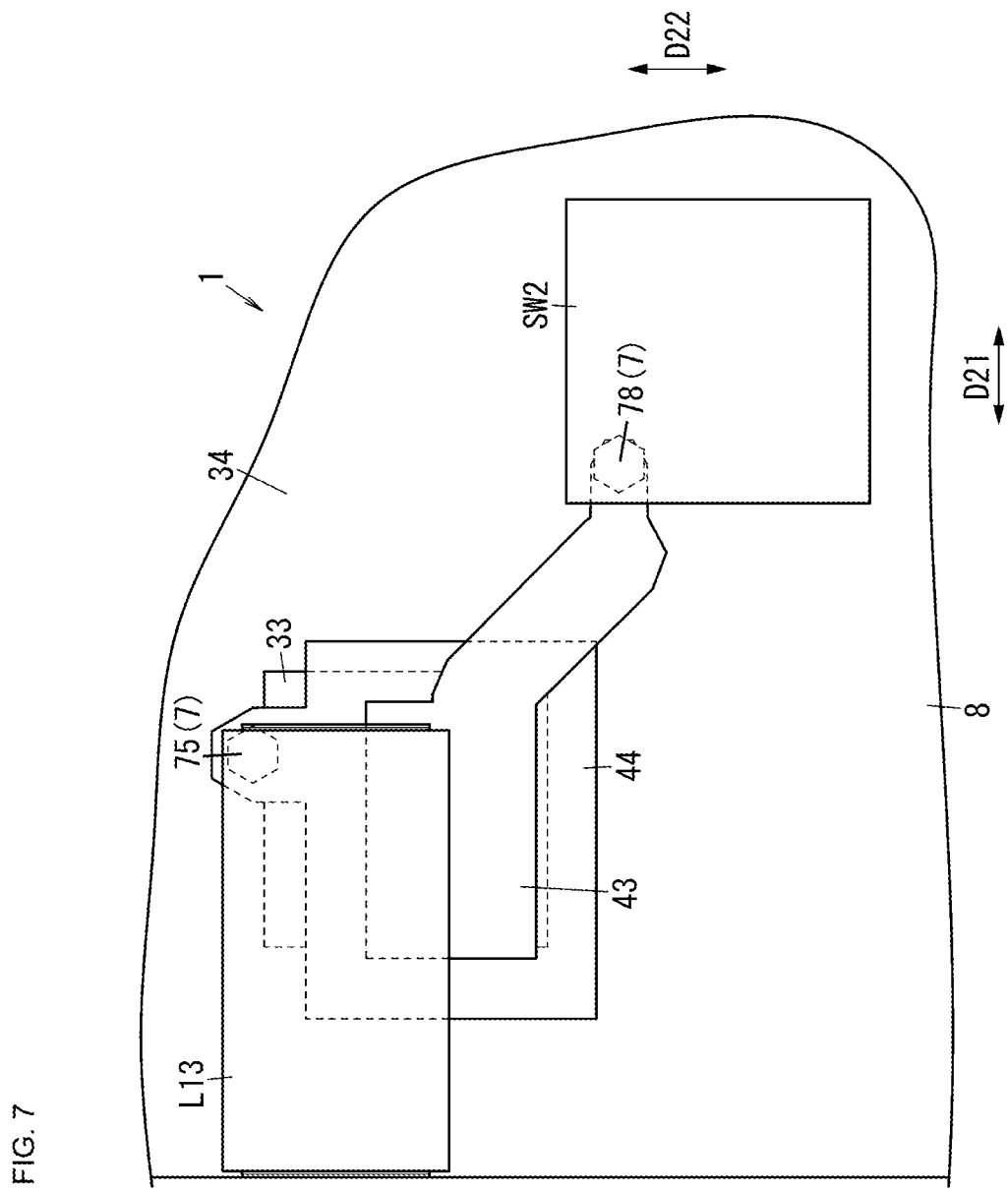
FIG. 7 is a plan view of the second principal part of the multilayer substrate.
Figure 8:
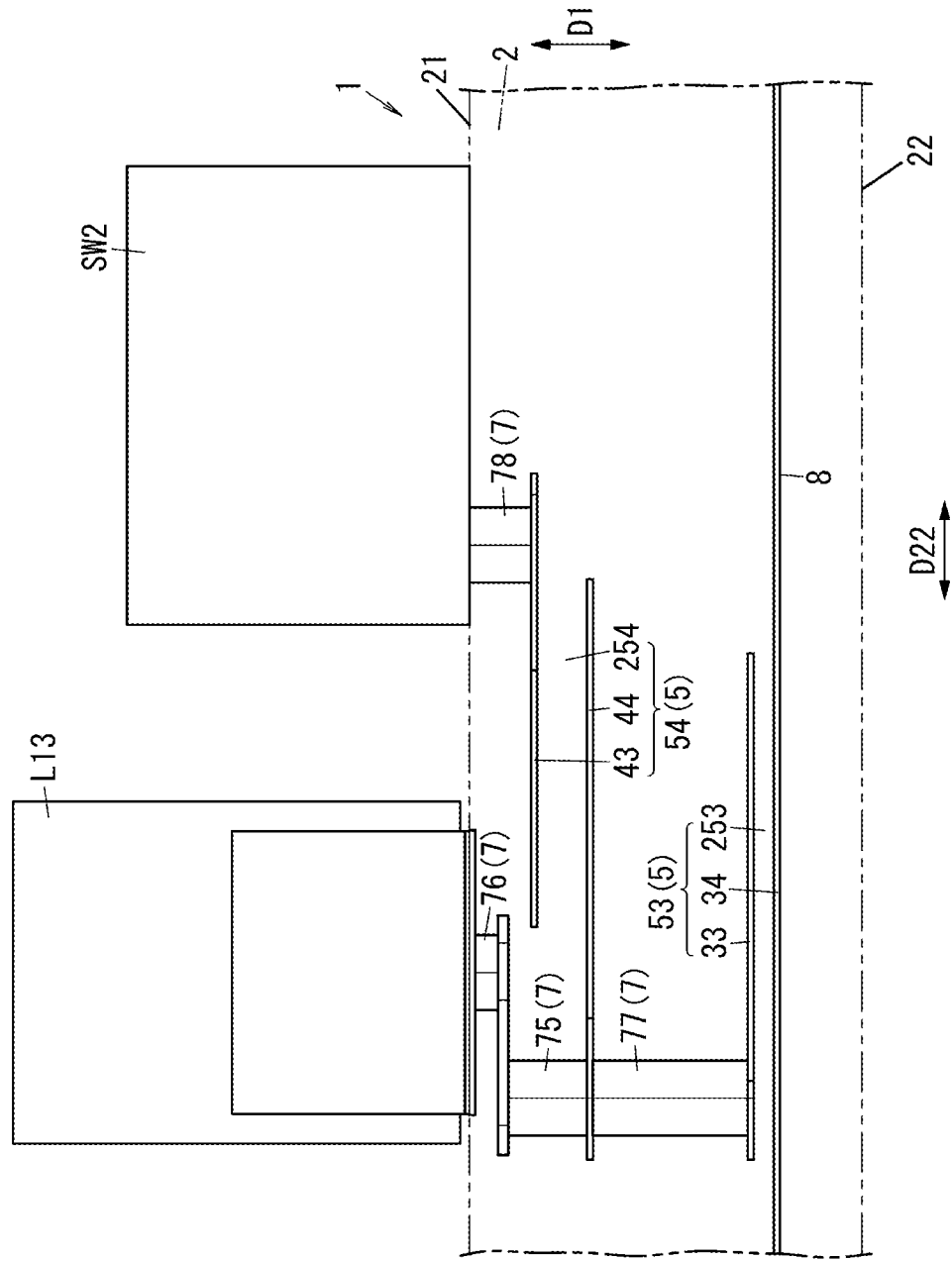
FIG. 8 is a left-hand side view of the second principal part of the multilayer substrate.

The multilayer substrate 1 according to Embodiment 1 includes a plurality of capacitors 5 (eight capacitors 5) (see FIGS. 1 and 5). Of the eight capacitors 5, two capacitors 5 (a first capacitor 51 and a second capacitor 52) are illustrated in FIGS. 1 to 4, and another two capacitors 5 (a first capacitor 53 and a second capacitor 54) are illustrated in FIGS. 5 to 8. A dielectric substrate 2 is represented by an imaginary line in each of FIGS. 1, 4, 5, and 8 and is omitted from FIGS. 2, 3, 6, and 7.

Figure 11:
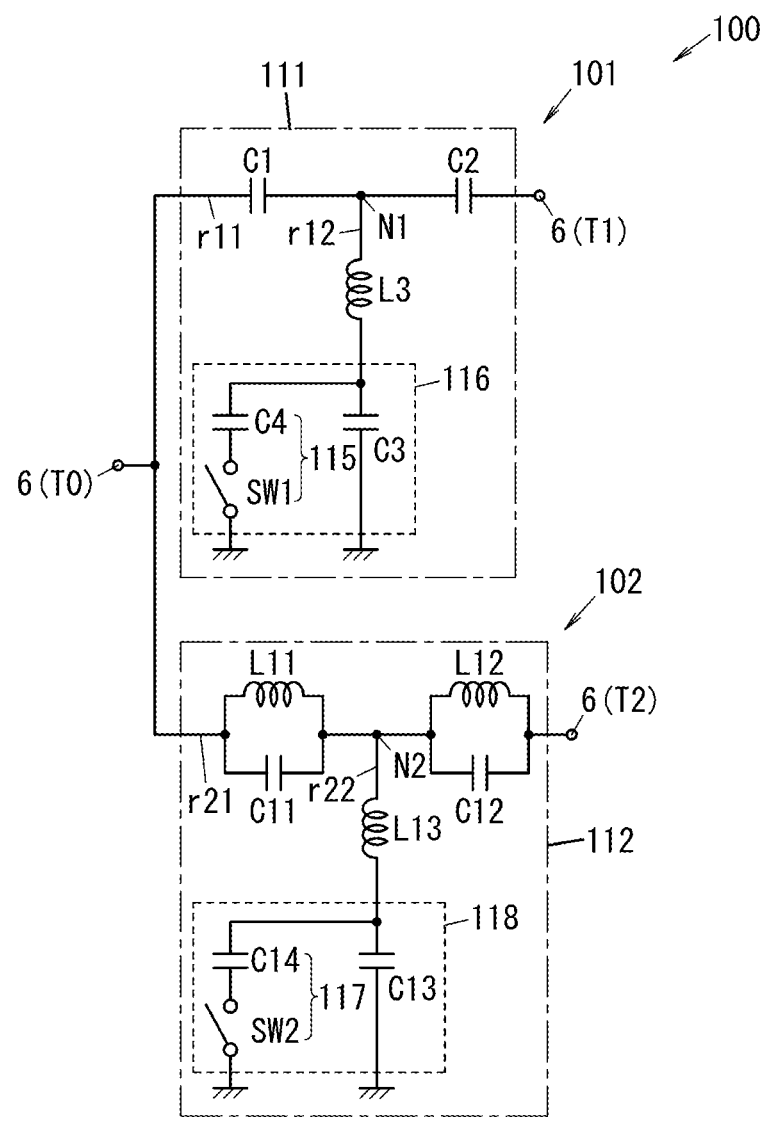
FIG. 11 is a circuit diagram of the multiplexer.

As illustrated in FIG. 1, the multilayer substrate 1 includes the dielectric substrate 2, a pair of first capacitor electrodes (a first capacitor electrode 31 and a first capacitor electrode 32), and a pair of second capacitor electrodes (a second capacitor electrode 41 and a second capacitor electrode 42). The multilayer substrate 1 also includes: a plurality of input/output electrodes 6 (e.g., three input/output electrodes 6 as illustrated in FIG. 11), each of which is an electrode for input, an electrode for output, or an electrode for input and output; a ground electrode; a control electrode; and a power supply electrode.

Figure 10:
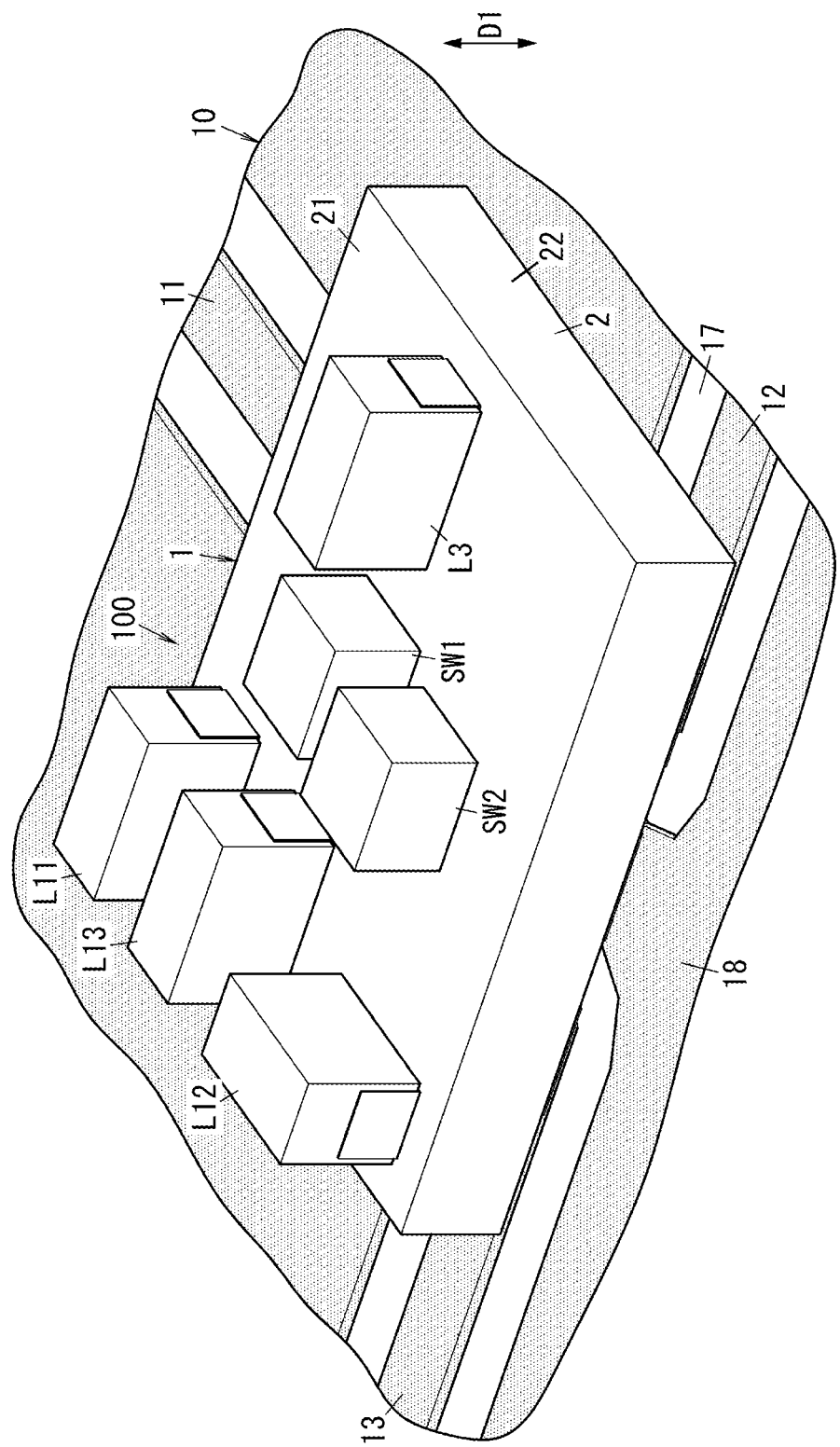
FIG. 10 is a perspective view of a multiplexer according to Embodiment 1 of the present disclosure.

As illustrated in FIG. 10, the multilayer substrate 1 in actual use is mounted on, for example, a circuit board 10. Each input/output electrode 6, the ground electrode, the control electrode, and the power supply electrode are electrically and mechanically connected to the circuit board 10 via a plurality of connecting portions (not illustrated). The connecting portions are made from, for example, solder. The circuit board 10 is not a constituent element of the multilayer substrate 1. The circuit board 10 is, for example, a printed wiring board.

As illustrated in FIG. 1, the first capacitor 51, which is one of the capacitors 5 included in the multilayer substrate 1, includes the first capacitor electrodes 31 and 32 paired with each other and a dielectric portion 251. The dielectric portion 251 is part of the dielectric substrate 2 and is located between the first capacitor electrodes 31 and 32. The first capacitor electrodes 31 and 32 are paired electrodes for the first capacitor 51. The second capacitor 52 includes the second capacitor electrodes 41 and 42 paired with each other and a dielectric portion 252. The dielectric portion 252 is part of the dielectric substrate 2 and is located between the second capacitor electrodes 41 and 42. The second capacitor electrodes 41 and 42 are paired electrodes for the second capacitor 52.

(2) Overall Configuration of Multiplexer

A multiplexer 100 according to Embodiment 1 is a diplexer and includes a first filter 101 and a second filter 102 as illustrated in FIG. 11.

(2.1) First Filter

As illustrated in FIG. 11, the first filter 101 includes: an antenna-side terminal T0; a first terminal T1, which is different from the antenna-side terminal T0; and a first filter functional unit 111. The antenna-side terminal T0 is electrically connected to an antenna external to the first filter 101. The first filter functional unit 111 is disposed between the antenna-side terminal T0 and the first terminal T1. The antenna-side terminal T0 and the first terminal T1 are ones of the input/output electrodes 6 of the multilayer substrate 1 and are different from each other.

The antenna-side terminal T0 is electrically connected to, for example, a conductor portion 11 (see FIG. 10) of the circuit board 10 via a connecting portion (not illustrated). Thus, the antenna-side terminal T0 is electrically connected via the circuit board 10 to the antenna external to the first filter 101. The first terminal T1 is electrically connected to, for example, a conductor portion 12 (see FIG. 10) of the circuit board 10 via a connecting portion (not illustrated). The conductor portion 12 is provided on an insulating layer 17 of the circuit board 10. Thus, the first terminal T1 is electrically connected via the circuit board 10 to an amplifier circuit external to the first filter 101.

The first filter 101 is an LC filter. Specifically, the first filter 101 is a T-type LC filter. The first filter functional unit 111 of the first filter 101 includes two series-arm capacitors (a first series-arm capacitor C1 and a second series-arm capacitor C2), a parallel-arm inductor L3, and a parallel-arm capacitor C3.

The first series-arm capacitor C1 and the second series-arm capacitor C2 are disposed on a first series-arm path r11, which forms a connection between the antenna-side terminal T0 and the first terminal T1. One end of the first series-arm capacitor C1 in the first filter 101 is connected to the antenna-side terminal T0, and the other end of the first series-arm capacitor C1 is connected to one end of the second series-arm capacitor C2. The other end of the second series-arm capacitor C2 in the first filter 101 is connected to the first terminal T1.

The parallel-arm inductor L3 and the parallel-arm capacitor C3 are disposed on a first parallel-arm path r12, which forms a connection between the ground terminal (ground) and a node N1 on the first series-arm path r11. The ground terminal is a ground electrode (not illustrated) of the multilayer substrate 1. The multilayer substrate 1 includes a ground layer 8 (see FIG. 1), which is electrically connected to the ground electrode. The ground terminal is electrically connected to, for example, a ground conductor portion 18 (see FIG. 10) of the circuit board 10 via a connecting portion (not illustrated). The ground conductor portion 18 is provided on the insulating layer 17 of the circuit board 10.

The first filter 101 also includes a capacitance adjustment capacitor C4 and a switch SW1. The capacitance adjustment capacitor C4 and the switch SW1 in the first filter 101 are connected in series to constitute a series circuit 115. The series circuit 115, namely, the capacitance adjustment capacitor C4 and the switch SW1 are connected parallel to the parallel-arm capacitor C3. That is, the parallel-arm capacitor C3 and the series circuit 115 are connected in parallel to constitute a parallel circuit 116. The parallel-arm inductor L3 and the parallel circuit 116 are connected in series. The switch SW1 in the first filter 101 is electrically connected between the capacitance adjustment capacitor C4 and the ground electrode.

The parallel-arm capacitor C3 in the first filter 101 is the first capacitor 51 (see FIG. 1) included in the multilayer substrate 1, and the capacitance adjustment capacitor C4 in the first filter 101 is the second capacitor 52 (see FIG. 1) included in the multilayer substrate 1.

The parallel-arm inductor L3 and the switch SW1 in the first filter 101 are mounted on the multilayer substrate 1 so as to face a first main surface 21 of the dielectric substrate 2 (see FIGS. 1 and 10). The parallel-arm inductor L3 is, for example, a surface-mount inductor. The switch SW1 is, for example, a semiconductor switch and includes a pair of main terminals and a control terminal. One terminal and the other terminal of the pair main terminals of the switch SW1 are respectively connected to the capacitance adjustment capacitor C4 and the ground electrode. The control terminal of the switch SW1 is connected to the control electrode. It is not required that the parallel-arm inductor L3 be a surface-mount inductor. The parallel-arm inductor L3 may be part of the multilayer substrate 1.

The first filter 101 allows passage of signals in the pass band of the first filter 101 and attenuates signals in frequency bands other than the pass band. On-off control of the switch SW1 in the first filter 101 is performed by a control circuit. Consequently, the attenuation pole frequency on the low-frequency side of the pass-band lower limit frequency of the first filter 101 varies, and the filter characteristics of the first filter 101 vary accordingly. The control circuit that performs on-off control of switch SW1 is electrically connected to the control terminal of the switch SW1. The control circuit is, for example, a controlling integrated circuit (IC). Constituent components of the control circuit may be mounted on the multilayer substrate 1. Alternatively, the components may be included in a radio-frequency front-end circuit including the multiplexer 100 or in a communication device including the multiplexer 100 in such a manner that the components are disposed outside the first filter 101.

(2.2) Second Filter

As illustrated in FIG. 11, the second filter 102 includes: the antenna-side terminal T0; a second terminal T2, which is different from the antenna-side terminal T0; and a second filter functional unit 112. The antenna-side terminal T0 is electrically connected to the antenna external to the second filter 102. The second filter functional unit 112 is disposed between the antenna-side terminal T0 and the second terminal T2. The antenna-side terminal T0 and the second terminal T2 are ones of the input/output electrodes 6 of the multilayer substrate 1 and are different from each other. In the multiplexer 100, the antenna-side terminal T0 is a terminal common to the second filter 102 and the first filter 101.

The antenna-side terminal T0 is electrically connected to, for example, the conductor portion 11 (see FIG. 10) of the circuit board 10 via the connecting portion (not illustrated). Thus, the antenna-side terminal T0 is electrically connected via the circuit board 10 to the antenna external to the second filter 102. The second terminal T2 is electrically connected to, for example, a conductor portion 13 (see FIG. 10) of the circuit board 10 via a connecting portion (not illustrated). The conductor portion 13 is provided on the insulating layer 17 (see FIG. 10) of the circuit board 10. Thus, the second terminal T2 is electrically connected via the circuit board 10 to the amplifier circuit external to the second filter 102.

The second filter 102 is an LC filter. Specifically, the second filter 102 is a T-type LC filter. The second filter functional unit 112 of the second filter 102 includes two series-arm capacitors (a first series-arm capacitor C11 and a second series-arm capacitor C12), two series-arm inductors (a first series-arm inductor L11 and a second series-arm inductor L12), a parallel-arm inductor L13, and a parallel-arm capacitor C13.

The first series-arm capacitor C11 and the second series-arm capacitor C12 are disposed on a second series-arm path r21, which forms a connection between the antenna-side terminal T0 and the second terminal T2. One end of the first series-arm capacitor C11 in the second filter 102 is connected to the antenna-side terminal T0, and the other end of the first series-arm capacitor C11 is connected to one end of the second series-arm capacitor C12. The other end of the second series-arm capacitor C12 in the second filter 102 is connected to the second terminal T2.

The first series-arm inductor L11 is connected parallel to the first series-arm capacitor C11. The second series-arm inductor L12 is connected parallel to the second series-arm capacitor C12.

The parallel-arm inductor L13 and the parallel-arm capacitor C13 are disposed on a second parallel-arm path r22, which forms a connection between the ground terminal (ground) and a node N2 on the second series-arm path r21. The ground terminal is a ground electrode (not illustrated) of the multilayer substrate 1. As mentioned above, the multilayer substrate 1 includes the ground layer 8 (FIGS. 1 and 5) electrically connected to the ground electrode. The ground electrode is electrically connected to, for example, the ground conductor portion 18 (see FIG. 10) of the circuit board 10 via a connecting portion (not illustrated). The ground conductor portion 18 is provided on the insulating layer 17 (see FIG. 10) of the circuit board 10.

The second filter 102 also includes a capacitance adjustment capacitor C14 and a switch SW2. The capacitance adjustment capacitor C14 and the switch SW2 in the second filter 102 are connected in series to constitute a series circuit 117. The series circuit 117, namely, the capacitance adjustment capacitor C14 and the switch SW2 are connected parallel to the parallel-arm capacitor C13. That is, the parallel-arm capacitor C13 and the series circuit 117 are connected in parallel to constitute a parallel circuit 118. The parallel-arm inductor L13 and the parallel circuit 118 are connected in series. The switch SW2 in the second filter 102 is electrically connected between the capacitance adjustment capacitor C14 and the ground electrode.

The parallel-arm capacitor C13 in the second filter 102 is the first capacitor 53 (see FIG. 5) included in the multilayer substrate 1, and the capacitance adjustment capacitor C14 in the second filter 102 is the second capacitor 54 (see FIG. 5) included in the multilayer substrate 1.

The parallel-arm inductor L13 and the switch SW2 in the second filter 102 are mounted on the multilayer substrate 1 so as to face the first main surface 21 of the dielectric substrate 2 (see FIGS. 5 and 10). The parallel-arm inductor L13 is, for example, a surface-mount inductor. The switch SW2 is, for example, a semiconductor switch and includes a pair of main terminals and a control terminal. One terminal and the other terminal of the pair of main terminals of the switch SW2 are respectively connected to the capacitance adjustment capacitor C14 and the ground electrode. The control terminal of the switch SW2 is connected to the control electrode. It is not required that the parallel-arm inductor L13 be a surface-mount inductor. The parallel-arm inductor L13 may be part of the multilayer substrate 1.

The second filter 102 allows passage of signals in the pass band of the second filter 102 and attenuates signals in frequency bands other than the pass band. On-off control of the switch SW2 in the second filter 102 is performed by a control circuit. Consequently, the attenuation pole frequency on the high-frequency side of the pass-band upper limit frequency of the second filter 102 varies, and the filter characteristics of the second filter 102 vary accordingly. The control circuit that performs on-off control of switch SW2 is electrically connected to the control terminal of the switch SW2. The control circuit is, for example, a controlling IC. Constituent components of the control circuit may be mounted on the multilayer substrate 1. Alternatively, the components may be included in a radio-frequency front-end circuit including the multiplexer 100 or in a communication device including the multiplexer 100 in such a manner that the components are disposed outside the second filter 102.

The first filter 101 and the second filter 102 have different pass bands. For example, the first filter 101 of the multiplexer 100 is a high-pass filter, and the second filter 102 of the multiplexer 100 is a low-pass filter. Thus, the pass band of the first filter 101 of the multiplexer 100 is in a frequency range higher than the pass band of the second filter 102 of the multiplexer 100. For example, the maximum frequency of the pass band of the second filter 102 of the multiplexer 100 is lower than the minimum frequency of the pass band of the first filter 101 of the multiplexer 100.

The multiplexer 100 illustrated in FIG. 10 may also include a cover layer (not illustrated). For example, the cover layer is disposed on the first main surface 21 of the dielectric substrate 2 so as to cover the components mounted on the multilayer substrate 1, or more specifically, the parallel-arm inductor L3, the first series-arm inductor L11, the second series-arm inductor L12, the parallel-arm inductor L13, the switch SW1, and the switch SW2. The cover layer is made of, for example, an epoxy resin.

(3) Details of Multilayer Substrate (3.1) Material of Multilayer Substrate

The multilayer substrate 1 illustrated in FIGS. 1 and 5 is, for example, a low-temperature co-fired ceramics (LTCC) substrate. The multilayer substrate 1 is a layered substrate including, for example, a plurality of dielectric layers and a plurality of conductor pattern layers. The conductor pattern layers are electrodes. The dielectric layers and the conductor pattern layers are layered in a thickness direction D1 of the dielectric substrate 2. In this case, the conductor pattern layers are made of, for example, copper. Thus, the first capacitor electrodes 31 and 32 paired with each other, first capacitor electrodes 33 and 34 paired with each other, the second capacitor electrodes 41 and 42 paired with each other, and second capacitor electrodes 43 and 44 paired with each other, each of which will be described later, are made of, for example, copper. The material of the conductor pattern layers is not limited to copper and may be, for example, silver or gold. The dielectric layers constituting the dielectric substrate 2 may be made of the same material. Alternatively, the material of at least one of the dielectric layers may be different from the material of the other dielectric layers. The conductor pattern layers may be made of the same material. Alternatively, the material of at least one of the conductor pattern layers may be different from the material of the other conductor pattern layers.

(3.2) Dielectric Substrate

The dielectric substrate 2 is plate-like in shape. As illustrated in FIG. 1, the dielectric substrate 2 has the first main surface 21 and a second main surface 22, which are opposite to each other in the thickness direction D1 of the dielectric substrate 2. The dielectric substrate 2 and the multilayer substrate 1 are, for example, rectangular when viewed in plan in the thickness direction D1 of the dielectric substrate 2.

The dielectric substrate 2 includes a plurality of dielectric layers. The dielectric layers of the dielectric substrate 2 are illustrated without boundaries between dielectric layers adjacent to each other in the thickness direction D1. Each dielectric layer has electrical insulation properties. The dielectric substrate 2 has electrical insulation properties accordingly. The outer shape of each dielectric layer is identical to the outer shape of the dielectric substrate 2.

The dielectric layers of the dielectric substrate 2 have the corresponding conductor pattern layers formed therein. The conductor pattern layers are formed into the predetermined patterns. Each conductor pattern layer includes one or more conductor layers extending in a plane orthogonal to the thickness direction D1 of the dielectric substrate 2.

As illustrated in FIGS. 1 to 4, the parallel-arm inductor L3 (a first element) and the switch SW1 (a second element) are disposed on the dielectric substrate 2. More specifically, the parallel-arm inductor L3 and the switch SW1 are mounted on the first main surface 21 of the dielectric substrate 2. The parallel-arm inductor L3 and the first capacitor 51 (the parallel-arm capacitor C3) are connected in series (see FIG. 11). The switch SW1 and the second capacitor 52 (the capacitance adjustment capacitor C4) are connected in series (see FIG. 11).

As illustrated in FIGS. 5 to 8, the parallel-arm inductor L13 (a first element) and the switch SW2 (a second element) are disposed on the dielectric substrate 2. More specifically, the parallel-arm inductor L13 and the switch SW2 are mounted on the first main surface 21 of the dielectric substrate 2. The parallel-arm inductor L13 and the first capacitor 53 (the parallel-arm capacitor C13) are connected in series (see FIG. 11). The switch SW2 and the second capacitor 54 (the capacitance adjustment capacitor C14) are connected in series (see FIG. 11).

(3.3) Ground Layer

The ground layer 8 illustrated in FIGS. 1 and 5 is one of the conductor pattern layers of the dielectric substrate 2. The ground layer 8 is a conductor pattern layer including the first capacitor electrode 32 (see FIG. 1) and the first capacitor electrode 34 (see FIG. 5).

The ground layer 8 is, for example, a ground electrode that is at ground potential via the circuit board 10 (see FIG. 10). As illustrated in FIGS. 1 and 5, the ground layer 8 is closer to the second main surface 22 than to the first main surface 21 of the dielectric substrate 2.

(3.4) First Principal Part of Multilayer Substrate

The following describes a first principal part of the multilayer substrate 1 with reference to FIGS. 1 to 4.

(3.4.1) First Capacitor Electrodes

As illustrated in FIGS. 1 to 4, the first capacitor electrodes 31 and 32 paired with each other are disposed in the dielectric substrate 2 so as to face each other in the thickness direction D1 of the dielectric substrate 2. The first capacitor electrodes 31 and 32 paired with each other are two of the conductor pattern layers and face each other in the thickness direction D1 of the dielectric substrate 2. That is, the first capacitor electrode 31 is one of the two conductor pattern layers, and the first capacitor electrode 32 is the other conductor pattern layer. The first capacitor electrode 32 is closer than the first capacitor electrode 31 to the second main surface 22 of the dielectric substrate 2.

The first capacitor electrode 31 is, for example, rectangular when viewed in plan in the thickness direction D1 of the dielectric substrate 2. The first capacitor electrode 32 is also used as the ground layer 8 (the ground electrode). The first capacitor electrodes 31 and 32 paired with each other in the multilayer substrate 1 are of different sizes when viewed in plan in the thickness direction D1.

The first capacitor electrodes 31 and 32 paired with each other constitute the first capacitor 51 electrically connected between the input/output electrode 6 (see FIG. 11) and the ground electrode. The capacitance of the first capacitor 51 including the first capacitor electrodes 31 and 32 paired with each other is determined by the area of an overlap between the first capacitor electrodes 31 and 32 viewed in plan in the thickness direction D1, the distance between the first capacitor electrodes 31 and 32 in the thickness direction D1, and the dielectric constant of the dielectric portion 251 being part of the dielectric substrate 2 and located between the first capacitor electrodes 31 and 32. The capacitance of the first capacitor 51 may be determined as appropriate in accordance with, for example, requirements specifications (filter characteristics) of the first filter 101 (see FIG. 11) including the first capacitor 51.

In the multilayer substrate 1 according to Embodiment 1, the first capacitor electrode 31, which is paired with the first capacitor electrode 32 and is closer than the first capacitor electrode 32 to the first main surface 21 of the dielectric substrate 2, has an electrode area smaller than the electrode area of the first capacitor electrode 32 closer to the second main surface 22 of the dielectric substrate 2. The electrode area of the first capacitor electrode 31 corresponds to the size of the first capacitor electrode 31 viewed in plan in the thickness direction D1. The electrode area of the first capacitor electrode 32 corresponds to the size of the first capacitor electrode 32 viewed in plan in the thickness direction D1. When the first capacitor electrodes 31 and 32 paired with each other are viewed in plan in the thickness direction D1, the first capacitor electrode 31 is located on the inner side with respect to the periphery of the first capacitor electrode 32 and entirely overlaps the first capacitor electrode 32.

(3.4.2) Second Capacitor Electrodes

As illustrated in FIGS. 1 to 4, the second capacitor electrodes 41 and 42 paired with each other are disposed in the dielectric substrate 2 so as to face each other in the thickness direction D1 of the dielectric substrate 2. The second capacitor electrodes 41 and 42 paired with each other are two of the conductor pattern layers and face each other in the thickness direction D1 of the dielectric substrate 2. That is, the second capacitor electrode 41 is one of the two conductor pattern layers, and the second capacitor electrode 42 is the other conductor pattern layer. The second capacitor electrode 41 is closer than the second capacitor electrode 42 to the first main surface 21.

The second capacitor electrodes 41 and 42 paired with each other are, for example, rectangular when viewed in plan in the thickness direction D1 of the dielectric substrate 2. The second capacitor electrodes 41 and 42 paired with each other in the multilayer substrate 1 are of different sizes when viewed in plan in the thickness direction D1.

The second capacitor electrodes 41 and 42 paired with each other constitute the second capacitor 52 connected parallel to the first capacitor 51. The capacitance of the second capacitor 52 including the second capacitor electrodes 41 and 42 paired with each other is determined by the area of an overlap between the second capacitor electrodes 41 and 42 viewed in plan in the thickness direction D1, the distance between the second capacitor electrodes 41 and 42 in the thickness direction D1, and the dielectric constant of the dielectric portion 252 being part of the dielectric substrate 2 and located between the second capacitor electrodes 41 and 42. The capacitance of the second capacitor 52 may be determined as appropriate in accordance with, for example, requirements specifications (filter characteristics) of the first filter 101 (see FIG. 11) including the second capacitor 52.

As illustrated in FIG. 1, the second capacitor electrodes 41 and 42 paired with each other are closer than the first capacitor electrodes 31 and 32 paired with each other to the first main surface 21 of the dielectric substrate 2.

In the multilayer substrate 1 according to Embodiment 1, the second capacitor electrode 41, which is paired with the second capacitor electrode 42 and is closer than the second capacitor electrode 42 to the first main surface 21 of the dielectric substrate 2, has an electrode area smaller than the electrode area of the second capacitor electrode 42 closer than the second capacitor electrode 41 to the second main surface 22 of the dielectric substrate 2. The electrode area of the second capacitor electrode 41 corresponds to the size of the second capacitor electrode 41 viewed in plan in the thickness direction D1. The electrode area of the second capacitor electrode 42 corresponds to the size of the second capacitor electrode 42 viewed in plan in the thickness direction D1. When the second capacitor electrodes 41 and 42 paired with each other are viewed in plan in the thickness direction D1, the second capacitor electrode 41 is located on the inner side with respect to the periphery of the second capacitor electrode 42 and entirely overlaps the second capacitor electrode 42.

(3.4.3) Positional Relationship Between First Capacitor Electrode and Second Capacitor Electrode As illustrated in FIGS. 1 to 4, the parallel-arm inductor L3 and the switch SW1, the second capacitor electrodes 41 and 42 paired with each other, the first capacitor electrodes 31 and 32 paired with each other, and the ground electrode are arranged in the stated order in the thickness direction D1 of the dielectric substrate 2.

When viewed in plan in the thickness direction D1, the second capacitor electrodes 41 and 42 paired with each other at least partially overlap the first capacitor electrodes 31 and 32 paired with each other. More specifically, when viewed in plan in the thickness direction D1, the second capacitor electrode 42, which is paired with the second capacitor electrode 41 and is closer than the second capacitor electrode 41 to the first capacitor 51, at least partially overlaps the first capacitor electrode 31, which is paired with the first capacitor electrode 32 and is closer than the first capacitor electrode 32 to the second capacitor 52. The second capacitor electrode 42, which is paired with the second capacitor electrode 41 and is closer than the second capacitor electrode 41 to the first capacitor 51, has an area greater than the area of the second capacitor electrode 41 farther than the second capacitor electrode 42 from the first capacitor 51. Furthermore, when viewed in plan in the thickness direction D1, the second capacitor electrode 42 closer to the first capacitor 51 at least partially overlaps the first capacitor electrode 32, which is paired with the first capacitor electrode 31 and is farther than the first capacitor electrode 31 from the second capacitor 52.

Figure 9:
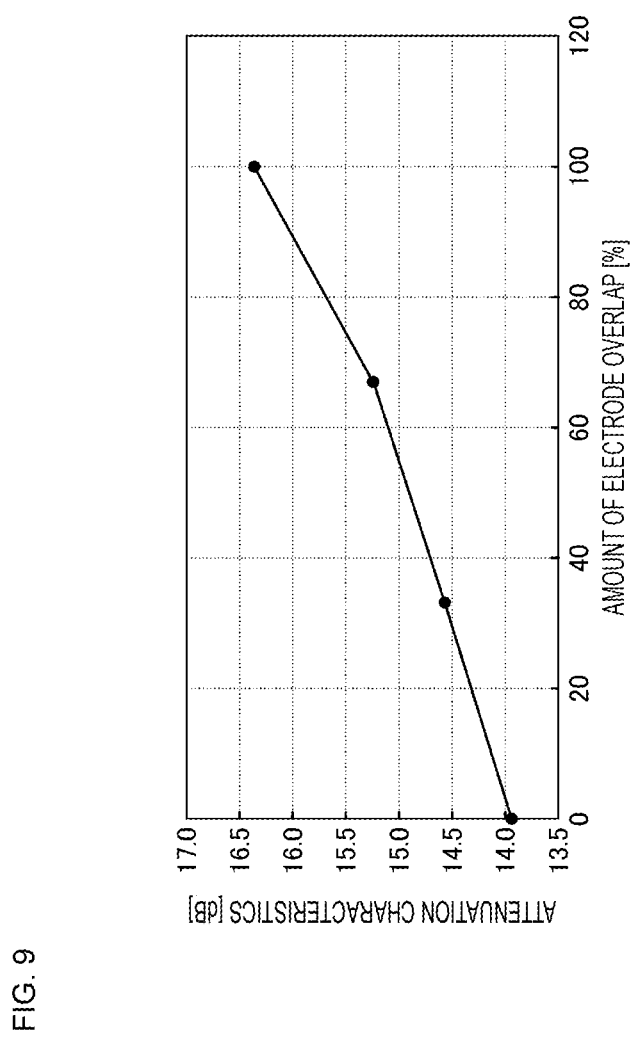
FIG. 9 is a graph illustrating the relationship between the amount of electrode overlap in the multilayer substrate and attenuation characteristics.

As illustrated in FIG. 9, attenuation characteristics improve as the proportion in which the second capacitor electrodes 41 and 42 overlap the first capacitor electrodes 31 and 32 (hereinafter referred to as "amount of electrode overlap") increases. In particular, the amount of electrode overlap is preferably greater than or equal to 60%, where the attenuation characteristics of 15 dB may be attained. The amount of electrode overlap is more preferably greater than or equal to 70%.

(3.5) Second Principal Part of Multilayer Substrate

The following describes a second principal part of the multilayer substrate 1 with reference to FIGS. 5 to 8.

(3.5.1) First Capacitor Electrodes

As illustrated in FIGS. 5 to 8, the first capacitor electrodes 33 and 34 paired with each other are disposed in the dielectric substrate 2 so as to face each other in the thickness direction D1 of the dielectric substrate 2. The first capacitor electrodes 33 and 34 paired with each other are two of the conductor pattern layers and face each other in the thickness direction D1 of the dielectric substrate 2. That is, the first capacitor electrode 33 is one of the two conductor pattern layers, and the first capacitor electrode 34 is the other conductor pattern layer. The first capacitor electrode 34 is closer than the first capacitor electrode 33 to the second main surface 22 of the dielectric substrate 2.

The first capacitor electrode 33 is, for example, rectangular when viewed in plan in the thickness direction D1 of the dielectric substrate 2. The first capacitor electrode 34 is also used as the ground layer 8 (the ground electrode). The first capacitor electrodes 33 and 34 paired with each other in the multilayer substrate 1 are of different sizes when viewed in plan in the thickness direction D1.

The first capacitor electrodes 33 and 34 paired with each other constitute the first capacitor 53 electrically connected between the input/output electrode 6 (see FIG. 11) and the ground electrode. The capacitance of the first capacitor 53 including the first capacitor electrodes 33 and 34 paired with each other is determined by the area of an overlap between the first capacitor electrodes 33 and 34 viewed in plan in the thickness direction D1, the distance between the first capacitor electrodes 33 and 34 in the thickness direction D1, and the dielectric constant of a dielectric portion 253, which is part of the dielectric substrate 2 and located between the first capacitor electrodes 33 and 34. The capacitance of the first capacitor 53 may be determined as appropriate in accordance with, for example, requirements specifications (filter characteristics) of the second filter 102 including the first capacitor 53.

In the multilayer substrate 1 according to Embodiment 1, the first capacitor electrode 33, which is paired with the first capacitor electrode 34 and is closer than the first capacitor electrode 34 to the first main surface 21 of the dielectric substrate 2, has an electrode area smaller than the electrode area of the first capacitor electrode 34 closer than the first capacitor electrode 33 to the second main surface 22 of the dielectric substrate 2. The electrode area of the first capacitor electrode 33 corresponds to the size of the first capacitor electrode 33 viewed in plan in the thickness direction D1. The electrode area of the first capacitor electrode 34 corresponds to the size of the first capacitor electrode 34 viewed in plan in the thickness direction D1. When the first capacitor electrodes 33 and 34 paired with each other are viewed in plan in the thickness direction D1, the first capacitor electrode 33 is located on the inner side with respect to the periphery of the first capacitor electrode 34 and entirely overlaps the first capacitor electrode 34.

(3.5.2) Second Capacitor Electrodes

As illustrated in FIGS. 5 to 8, the second capacitor electrodes 43 and 44 paired with each other are disposed in the dielectric substrate 2 so as to face each other in the thickness direction D1 of the dielectric substrate 2. The second capacitor electrodes 43 and 44 paired with each other are two of the conductor pattern layers and face each other in the thickness direction D1 of the dielectric substrate 2. That is, the second capacitor electrode 43 is one of the two conductor pattern layers, and the second capacitor electrode 44 is the other conductor pattern layer. The second capacitor electrode 43 is closer than the second capacitor electrode 44 to the first main surface 21.

The second capacitor electrodes 43 and 44 paired with each other are, for example, rectangular when viewed in plan in the thickness direction D1 of the dielectric substrate 2. The second capacitor electrodes 43 and 44 paired with each other in the multilayer substrate 1 are of different sizes when viewed in plan in the thickness direction D1.

The second capacitor electrodes 43 and 44 paired with each other constitute the second capacitor 54 connected parallel to the first capacitor 53. The capacitance of the second capacitor 54 including the second capacitor electrodes 43 and 44 paired with each other is determined by the area of an overlap between the second capacitor electrodes 43 and 44 viewed in plan in the thickness direction D1, the distance between the second capacitor electrodes 43 and 44 in the thickness direction D1, and the dielectric constant of a dielectric portion 254, which is part of the dielectric substrate 2 and located between the second capacitor electrodes 43 and 44. The capacitance of the second capacitor 54 may be determined as appropriate in accordance with, for example, requirements specifications (filter characteristics) of the second filter 102 including the second capacitor 54.

As illustrated in FIG. 5, the second capacitor electrodes 43 and 44 paired with each other are closer than the first capacitor electrodes 33 and 34 paired with each other to the first main surface 21 of the dielectric substrate 2.

In the multilayer substrate 1 according to Embodiment 1, the second capacitor electrode 43, which is paired with the second capacitor electrode 44 and is closer than the second capacitor electrode 44 to the first main surface 21 of the dielectric substrate 2, has an electrode area smaller than the electrode area of the second capacitor electrode 44 closer than the second capacitor electrode 43 to the second main surface 22 of the dielectric substrate 2. The electrode area of the second capacitor electrode 43 corresponds to the size of the second capacitor electrode 43 viewed in plan in the thickness direction D1. The electrode area of the second capacitor electrode 44 corresponds to the size of the second capacitor electrode 44 viewed in plan in the thickness direction D1. When the second capacitor electrodes 43 and 44 paired with each other are viewed in plan in the thickness direction D1, the second capacitor electrode 43 is located on the inner side with respect to the periphery of the second capacitor electrode 44 and entirely overlaps the second capacitor electrode 44.

(3.5.3) Positional Relationship Between First Capacitor Electrode and Second Capacitor Electrode As illustrated in FIGS. 5 to 8, the parallel-arm inductor L13 and the switch SW2, the second capacitor electrodes 43 and 44 paired with each other, the first capacitor electrodes 33 and 34 paired with each other, and the ground electrode are arranged in the stated order in the thickness direction D1 of the dielectric substrate 2.

When viewed in plan in the thickness direction D1, the second capacitor electrodes 43 and 44 paired with each other at least partially overlap the first capacitor electrodes 33 and 34 paired with each other. More specifically, when viewed in plan in the thickness direction D1, the second capacitor electrode 44, which is paired with the second capacitor electrode 43 and is closer than the second capacitor electrode 43 to the first capacitor 53, at least partially overlaps the first capacitor electrode 33, which is paired with the first capacitor electrode 34 and is closer than the first capacitor electrode 34 to the second capacitor 54. The second capacitor electrode 44, which is paired with the second capacitor electrode 43 and is closer than the second capacitor electrode 43 to the first capacitor 53, has an area greater than the area of the second capacitor electrode 43 farther than the second capacitor electrode 44 from the first capacitor 53. Furthermore, when viewed in plan in the thickness direction D1, the second capacitor electrode 44 closer to the first capacitor 53 at least partially overlaps the first capacitor electrode 34, which is paired with the first capacitor electrode 33 and is farther than the first capacitor electrode 33 from the second capacitor 54.

(3.6) Electrodes

The input/output electrodes 6 illustrated in FIG. 11, the ground electrode, the control electrode, and the power supply electrode are disposed on the second main surface 22 (see FIGS. 1 and 5) of the dielectric substrate 2. The input/output electrodes 6, the ground electrode, the control electrode, and the power supply electrode on the second main surface 22 of the dielectric substrate 2 are discretely located away from each other. The input/output electrodes 6, the ground electrode, the control electrode, and the power supply electrode are electrically insulated from each other accordingly.

As illustrated in FIG. 11, the input/output electrodes 6 include the antenna-side terminal T0, the first terminal T1, and the second terminal T2. The antenna-side terminal T0 is electrically connected to the first series-arm capacitor C1 of the first filter functional unit 111 and to the first series-arm capacitor C11 in the second filter 102. The first terminal T1 is electrically connected to the second series-arm capacitor C2 of the first filter functional unit 111. The second terminal T2 is electrically connected to the second series-arm capacitor C12 of the second filter functional unit 112. The ground electrode is electrically connected to the ground layer 8. The control electrode is electrically connected to the control terminal of the switch SW1 of the first filter functional unit 111. The power supply electrode is electrically connected to a power supply.

(3.7) Via Conductors

As illustrated in FIGS. 1 and 5, the multilayer substrate 1 includes a plurality of via conductors 7 (connection path portions). The via conductors 7 are disposed in the dielectric substrate 2. Each via conductor 7 extends through one or more dielectric layers and has a first end face and a second end face in the thickness direction D1 of the dielectric substrate 2. Each via conductor 7 forms an electrical connection between a conductor portion of a conductor pattern layer in contact with the first end face and a conductor portion of a conductor pattern layer in contact with the second end face. The via conductors 7 and the conductor pattern layers may be made of the same material. Thus, the via conductors 7 are made of, for example, copper. The material of the via conductors 7 is not limited to copper and may be, for example, silver or gold.

The via conductors 7 include a via conductor 71 and a via conductor 72, each of which forms an electrical connection between the corresponding one of two capacitors 5 (the second series-arm capacitors C2 and C12) and the corresponding one of two input/output electrodes 6 (the first terminal T1 and second terminal T2). The via conductor 71 forms an electrical connection between the second series-arm capacitor C2 of the first filter functional unit 111 and the input/output electrode 6 (the first terminal T1). The via conductor 72 forms an electrical connection between the second series-arm capacitor C12 of the second filter functional unit 112 and the input/output electrode 6 (the second terminal T2).

As illustrated in FIG. 1, the via conductor 71, which is one of the via conductors 7, forms an electrical connection between the parallel-arm inductor L3 and the second capacitor 52. More specifically, the via conductors 71 and 72 form an electrical connection between the parallel-arm inductor L3 and the second capacitor electrode 42 of the second capacitor 52. That is, a connection path portion that forms an electrical connection between the parallel-arm inductor L3 and the second capacitor 52 is constructed of the via conductors 71 and 72.

A via conductor 73, which is one of the via conductors 7, forms an electrical connection between the parallel-arm inductor L3 and the first capacitor 51. More specifically, the via conductors 71, 72, and 73 form an electrical connection between the parallel-arm inductor L3 and the first capacitor electrode 31 of the first capacitor 51. That is, a connection path portion that forms an electrical connection between the parallel-arm inductor L3 and the first capacitor electrode 31 is constructed of the via conductors 71, 72, and 73.

A via conductor 74, which is one of the via conductors 7, forms an electrical connection between the switch SW1 and the second capacitor 52. More specifically, the via conductor 74 forms an electrical connection between the switch SW1 and the second capacitor electrode 41 of the second capacitor 52. That is, a connection path portion that forms an electrical connection between the switch SW1 and the second capacitor electrode 41 is constructed of the via conductor 74.

As illustrated in FIG. 5, a via conductor 75, which is one of the via conductors 7, forms an electrical connection between the parallel-arm inductor L13 and the second capacitor 54. More specifically, the via conductor 75 and a via conductor 76 form an electrical connection between the parallel-arm inductor L13 and the second capacitor electrode 44 of the second capacitor 54. That is, a connection path portion that forms an electrical connection between the parallel-arm inductor L13 and the second capacitor electrode 44 is constructed of the via conductors 75 and 76.

A via conductor 77, which is one of the via conductors 7, forms an electrical connection between the parallel-arm inductor L13 and the first capacitor 53. More specifically, the via conductors 75, 76, and 77 form an electrical connection between the parallel-arm inductor L13 and the first capacitor electrode 33 of the first capacitor 53. That is, a connection path portion that forms an electrical connection between the parallel-arm inductor L13 and the first capacitor electrode 33 is constructed of the via conductors 75, 76, and 77.

A via conductor 78, which is one of the via conductors 7, forms an electrical connection between the switch SW2 and the second capacitor 54. More specifically, the via conductor 78 forms an electrical connection between the switch SW2 and the second capacitor electrode 43 of the second capacitor 54. That is, a connection path portion that forms an electrical connection between the switch SW2 and the second capacitor electrode 43 is constructed of the via conductor 78.

As illustrated in FIG. 1, the via conductors 71, 72, and 73 overlap the first capacitor 51 when viewed in plan in the thickness direction D1. More specifically, the via conductors 71, 72, and 73 overlap both the first capacitor electrodes 31 and 32 when viewed in plan in the thickness direction D1.

Similarly, as illustrated in FIG. 5, the via conductors 75, 76, and 77 overlap the first capacitor 53 when viewed in plan in the thickness direction D1. More specifically, the via conductors 75, 76, and 77 overlap both the first capacitor electrodes 33 and 34 when viewed in plan in the thickness direction D1.

(4) Effects

As described above, the parallel-arm inductor L3 and the switch SW1, the second capacitor electrodes 41 and 42 paired with each other, the first capacitor electrodes 31 and 32 paired with each other, and the ground electrode of the multilayer substrate 1 according to Embodiment 1 are arranged in the stated order in the thickness direction D1 of the dielectric substrate 2. When viewed in plan in the thickness direction D1, the second capacitor electrodes 41 and 42 paired with each other at least partially overlap the first capacitor electrodes 31 and 32 paired with each other. The stray capacitance between the ground electrode and the pair of second capacitor electrodes (the second capacitor electrodes 41 and 42 paired with each other) may be suppressed accordingly. The first filter 101 including the multilayer substrate 1 configured as described above thus has desired characteristics and is capable of serving as a high-pass filter whose pass band is higher than or equal to a predetermined frequency.

Similarly, the parallel-arm inductor L13 and the switch SW2, the second capacitor electrodes 43 and 44 paired with each other, the first capacitor electrodes 33 and 34 paired with each other, and the ground electrode are arranged in the stated order in the thickness direction D1 of the dielectric substrate 2. When viewed in plan in the thickness direction D1, the second capacitor electrodes 43 and 44 paired with each other at least partially overlap the first capacitor electrodes 33 and 34 paired with each other. The stray capacitance between the ground electrode and the pair of second capacitor electrodes (the second capacitor electrodes 43 and 44 paired with each other) may be suppressed accordingly. The second filter 102 including the multilayer substrate 1 configured as described above thus has desired characteristics and is capable of serving as a low-pass filter whose pass band is lower than or equal to a predetermined frequency.

The filter including the multilayer substrate 1 is not limited to a high-pass filter or a low-pass filter and may serve as, for example, a band-pass filter or a band-elimination filter.

In the multilayer substrate 1 according to Embodiment 1, the first capacitor electrode 32, which is farther from the second capacitor 52, is also used as the ground electrode. Similarly, the first capacitor electrode 34, which is farther from the second capacitor 54, is also used as the ground electrode. The first capacitor electrode 32 may be set to or close to ideal ground potential accordingly.

(5) Radio-Frequency Front-End Circuit

Figure 12:
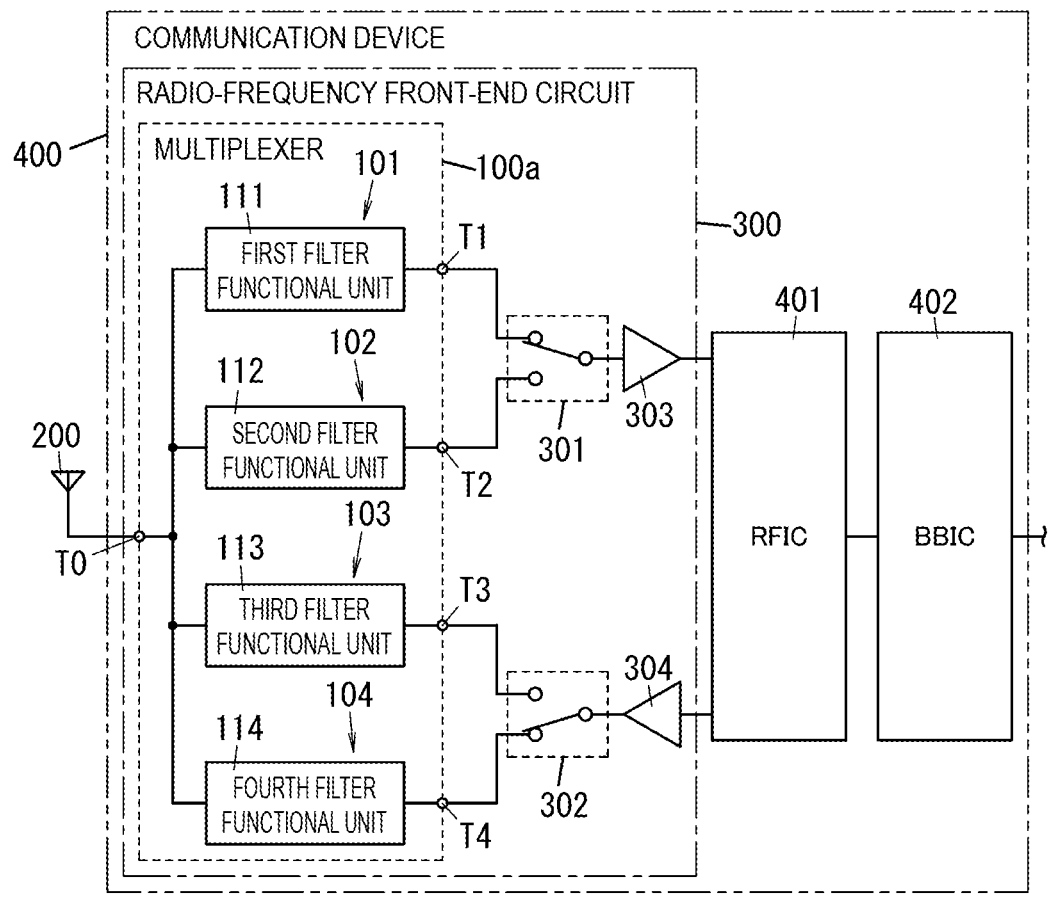
FIG. 12 is a configuration diagram of a communication device according to Embodiment 1 of the present disclosure.

The following describes a radio-frequency front-end circuit 300 according to an embodiment with reference to FIG. 12.

The radio-frequency front-end circuit 300 includes a multiplexer 100a, a first amplifier circuit 303, and a first switching circuit 301. The radio-frequency front-end circuit 300 also includes a second amplifier circuit 304 and a second switching circuit 302. The radio-frequency front-end circuit 300 may optionally include the second amplifier circuit 304 and the second switching circuit 302. Constituent elements of the multiplexer 100a that are similar to the constituent elements of the multiplexer 100 are denoted by the same reference signs, and redundant description thereof will be omitted.

In addition to having the configuration of the multiplexer 100 illustrated in FIG. 11, the multiplexer 100a includes a third terminal T3, a fourth terminal T4, a third filter functional unit 113, and a fourth filter functional unit 114. The multiplexer 100a includes, in addition to the first filter 101 and the second filter 102, a third filter 103 and a fourth filter 104 accordingly.

The third filter 103 includes the antenna-side terminal T0, the third filter functional unit 113, and the third terminal T3. The third filter functional unit 113 is disposed between the antenna-side terminal T0 and the third terminal T3. The third filter 103 is a first transmission-side filter. The third filter 103 allows passage of signals in the pass band of the third filter 103 and attenuates signals in frequency bands other than the pass band.

The fourth filter 104 includes the antenna-side terminal T0, the fourth filter functional unit 114, and the fourth terminal T4. The fourth filter functional unit 114 is disposed between the antenna-side terminal T0 and the fourth terminal T4. The fourth filter 104 is a second transmission-side filter. The fourth filter 104 allows passage of signals in the pass band of the fourth filter 104 and attenuates signals in frequency bands other than the pass band.

The first amplifier circuit 303 amplifies radio-frequency signals (reception signals) transmitted through an antenna 200, the multiplexer 100a, and the first switching circuit 301 and outputs the resultant signals. The first amplifier circuit 303 is a low-noise amplifier circuit.

The first switching circuit 301 includes: two selected terminals respectively connected to the first terminal T1 and the second terminal T2 of the multiplexer 100a; and a common terminal connected to the first amplifier circuit 303. That is, the first switching circuit 301 is connected to the first filter functional unit 111 via the first terminal T1 and is connected to the second filter functional unit 112 via the second terminal T2.

The first switching circuit 301 is, for example, a single-pole, double-throw (SPDT) switch. The first switching circuit 301 is controlled by a control circuit. The first switching circuit 301 connects the common terminal to one of the two selected terminals in accordance with a control signal from the control circuit. The first switching circuit 301 may be a switching IC. It is not required that the first switching circuit 301 connect the common terminal to one selected terminal. The first switching circuit 301 may connect the common terminal to more than one selected terminals. That is, the radio-frequency front-end circuit 300 may be configured to support carrier aggregation.

The second amplifier circuit 304 amplifies radio-frequency signals (transmission signals) outputted by a component outside the radio-frequency front-end circuit 300 (e.g., an RF signal processing circuit 401, which will be described later) and outputs the resultant signals to the antenna 200 through the second switching circuit 302 and the multiplexer 100a. The second amplifier circuit 304 is a power amplifier circuit.

The second switching circuit 302 is, for example, an SPDT switch. The second switching circuit 302 is controlled by the control circuit. The second switching circuit 302 connects a common terminal to one of two selected terminals in accordance with a control signal from the control circuit. The second switching circuit 302 may be a switching IC. It is not required that the second switching circuit 302 connect the common terminal to one selected terminal. The second switching circuit 302 may connect the common terminal to more than one terminals.

(6) Communication Device

As illustrated in FIG. 12, a communication device 400 includes the RF signal processing circuit 401 and the radio-frequency front-end circuit 300. The RF signal processing circuit 401 processes radio-frequency signals received through the antenna 200. The radio-frequency front-end circuit 300 transmits radio-frequency signals (reception signals and transmission signals) between the antenna 200 and the RF signal processing circuit 401. The communication device 400 also includes a baseband signal processing circuit 402. The baseband signal processing circuit 402 may be optionally included.

The RF signal processing circuit 401 is, for example, a radio-frequency integrated circuit (RFIC) and processes radio-frequency signals (reception signals). The RF signal processing circuit 401 performs, for example, signal processing such as down-conversion on radio-frequency signals (reception signals) inputted from the antenna 200 through the radio-frequency front-end circuit 300 and outputs the resultant reception signals to the baseband signal processing circuit 402. The baseband signal processing circuit 402 is, for example, a baseband integrated circuit (BBIC). The reception signals processed by the baseband signal processing circuit 402 are used, for example, as image signals for displaying an image or as audio signals for a telephone conversation.

The RF signal processing circuit 401 performs, for example, signal processing such as up-conversion on radio-frequency signals (transmission signals) outputted by the baseband signal processing circuit 402 and outputs the resultant radio-frequency signals to the second amplifier circuit 304. The baseband signal processing circuit 402 performs, for example, certain signal processing on the transmission signals received from outside the communication device 400.

(7) Modifications

The following describes modifications of the present embodiment.

In the multilayer substrate 1 according to Embodiment 1, the parallel-arm inductors L3 and L13 are respectively used as the first element in series with the first capacitor 51 and the first element in series with the first capacitor 53, and the switches SW1 and SW2 are respectively used as the second element in series with the second capacitor 52 and the second element in series with the second capacitor 54. In the multilayer substrate according to a modification of Embodiment 1, the first elements are not limited to the parallel-arm inductors L3 and L13. Similarly, the second elements are not limited to the switches SW1 and SW2. For example, the first elements may be switches, and the second elements may be inductors. Alternatively, the first elements and the second elements may be switches. The first elements are preferably inductors or switches.

It is not required that each of the first filter 101 and the second filter 102 be configured to handle transmission or reception only. Each of the first filter 101 and the second filter 102 may be configured to handle both transmission and reception. For example, the first filter 101 may be a filter that allows passage of radio-frequency signals in a high band specified by the Long Term Evolution (LTE) standard, and the second filter 102 may be a filter that allows passage of radio-frequency signals in a midband specified by the LTE standard.

It is not required that the multiplexer 100 be a constituent element of the radio-frequency front-end circuit 300 illustrated in FIG. 12. The multiplexer 100 may be a constituent component of a radio-frequency front-end circuit 300b illustrated in FIG. 13. Constituent elements of the radio-frequency front-end circuit 300b that are similar to the constituent components of the radio-frequency front-end circuit 300 are denoted by the same reference signs, and redundant description thereof will be omitted where appropriate.

The radio-frequency front-end circuit 300b is a reception front-end circuit. The radio-frequency front-end circuit 300b is configured to support simultaneous use of a plurality of (frequency) bands (e.g., carrier aggregation). The radio-frequency front-end circuit 300b includes the multiplexer 100, two switching circuits (switching circuits 311 and 312), five filters (filters 321, 322, 323, 324, and 325), and five amplifier circuits (amplifier circuits 331, 332, 333, 334, and 335).

As mentioned above, the multiplexer 100 includes the antenna-side terminal T0, the first terminal T1, the second terminal T2, the first filter functional unit 111, and the second filter functional unit 112.

The first filter functional unit 111 is disposed between the antenna-side terminal T0 and the first terminal T1. The first filter functional unit 111 is a high-pass filter. The pass band of the high-pass filter is a frequency range of a high-band group, and the attenuation band of the high-pass filter is a frequency range of a low-band group.

The second filter functional unit 112 is disposed between the antenna-side terminal T0 and the second terminal T2. The second filter functional unit 112 is a low-pass filter. The pass band of the low-pass filter is the frequency range of the low-band group, and the attenuation band of the low-pass filter is the frequency range of the high-band group.

The pass band of the first filter functional unit 111 is switched between a first frequency band and a second frequency band in accordance with an on-off action of the switch SW1 (see FIG. 11). The pass band of the second filter functional unit 112 is switched between a third frequency band and a fourth frequency band in accordance with an on-off action of the switch SW2 (see FIG. 11). The first and second frequency bands belong to a first frequency band group, and the third and fourth frequency bands belong to a second frequency band group.

The high-band group is the first frequency band group, and the low-band group is the second frequency band group.

The switching circuit 311 includes a common terminal 3110 and three selection terminals (selection terminals 3111, 3112, and 3113). In the switching circuit 311, the common terminal 3110 is connected to the first terminal T1 of the multiplexer 100. The switching circuit 311 is an SP3T switching circuit in which the common terminal 3110 may be connected to any one of three selection terminals (the selection terminal 3111, 3112, or 3113).

The switching circuit 312 includes a common terminal 3120 and two selection terminals (selection terminals 3121 and 3122). The switching circuit 312 is an SPDT switching circuit in which the common terminal 3120 may be connected to the selection terminal 3121 or 3122.

The filter 321 is connected to the selection terminal 3111 and is, for example, a band-pass filter whose pass band is LTE Band 7 (the reception band: 2,620 to 2,690 MHz). The filter 322 is connected to the selection terminal 3112 and is, for example, a band-pass filter whose pass band is LTE Band 40 (the reception band: 2,300 to 2,400 MHz). The filter 323 is connected to the selection terminal 3113 and is, for example, a band-pass filter whose pass band is LTE Band 41 (the reception band: 2,496 to 2,690 MHz). The filter 324 is connected to the selection terminal 3121 and is, for example, a band-pass filter whose pass band is LTE Band 1 (the reception band: 2,110 to 2,170 MHz). The filter 325 is connected to the selection terminal 3122 and is, for example, a band-pass filter whose pass band is LTE Band 3 (the reception band: 1,805 to 1,880 MHz). The order of the five bands associated with the LTE standard, from the lowest to the highest, is Band 3, Band 1, Band 40, Band 41, and Band 7. Bands 3 and 1 belong to the low-band group, and Bands 40, 41, and 7 belong to the high-band group.

The filters of the radio-frequency front-end circuit 300b are as follows. Each of the filters 322 and 323 is a filter whose pass band is the first frequency band. The filter 321 is a filter whose pass band is the second frequency band. The filter 325 is a filter whose pass band is the third frequency band. The filter 324 is a filter whose pass band is the fourth frequency band.

Each of the five amplifier circuits (the amplifier circuits 331 to 335) is connected to the corresponding one of the five filters (the filters 321 to 325). The five amplifier circuits (the amplifier circuits 331 to 335) are, for example, low-noise amplifier circuits. Of the five amplifier circuits (the amplifier circuits 331 to 335) included in the radio-frequency front-end circuit 300b, three amplifier circuits (the amplifier circuits 331 to 333) may be integrated into an amplifier circuit 330, and two amplifier circuits (the amplifier circuits 334 and 335) may be integrated into an amplifier circuit 340.

Figure 13:
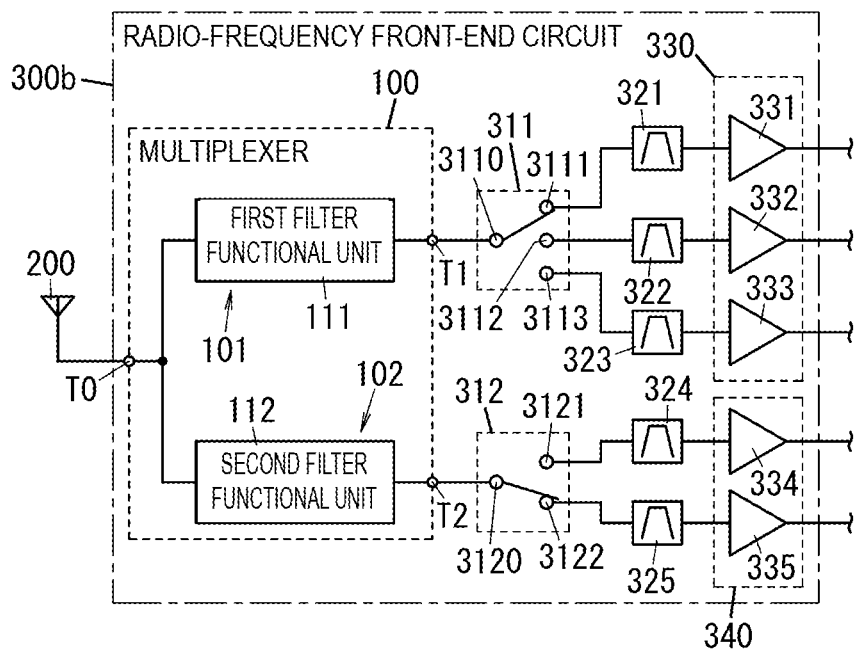
FIG. 13 is a configuration diagram of the radio-frequency front-end circuit according to a modification of Embodiment 1 of the present disclosure.

With the switching circuit 311 and the switching circuit 312 being connected as illustrated in FIG. 13, the radio-frequency front-end circuit 300b can simultaneously use a band belonging to the high-band group (e.g., Band 7) and a band belonging to the low-band group (e.g., Band 3). It is not required that the radio-frequency front-end circuit 300b be configured to support simultaneous use of two LTE bands as mentioned above. For example, the radio-frequency front-end circuit 300b may be configured to support simultaneous use of an LTE band and a 5G New Radio (NR) band specified by the fifth generation (5G) standard or may be configured to support simultaneous use of two 5G NR bands. The 5G NR bands are included in UHB (3.3 to 5 GHz).

Figure 14:
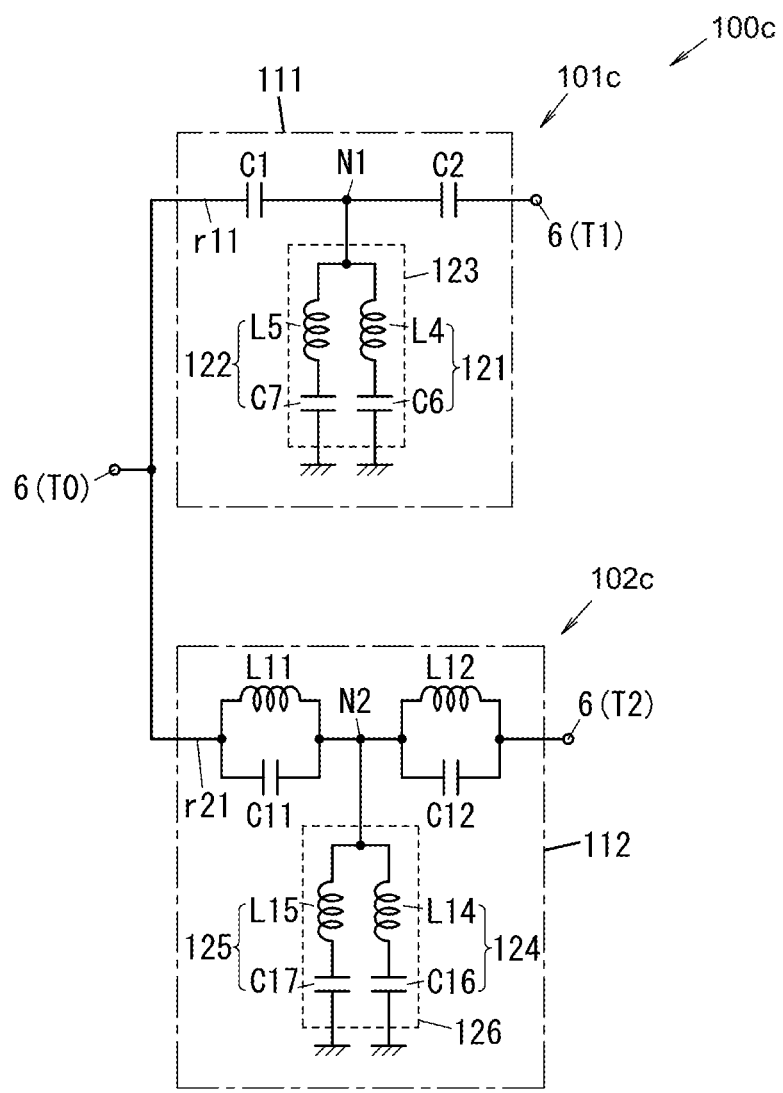
FIG. 14 is a circuit diagram of a multiplexer according to another modification of Embodiment 1 of the present disclosure.
Figure 15:
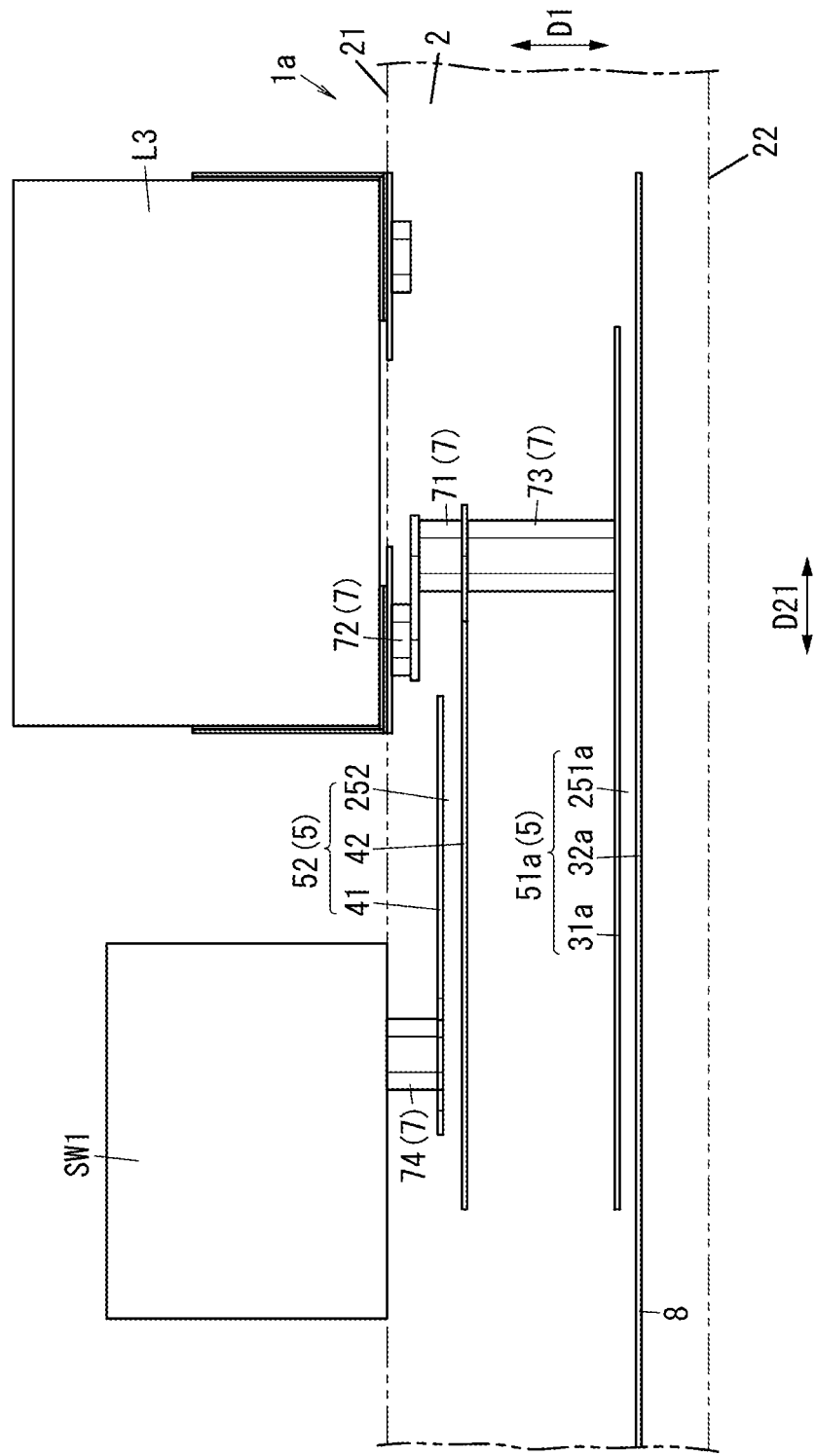
FIG. 15 is a front view of a principal part of a multilayer substrate according to Embodiment 2 of the present disclosure.
Figure 16:
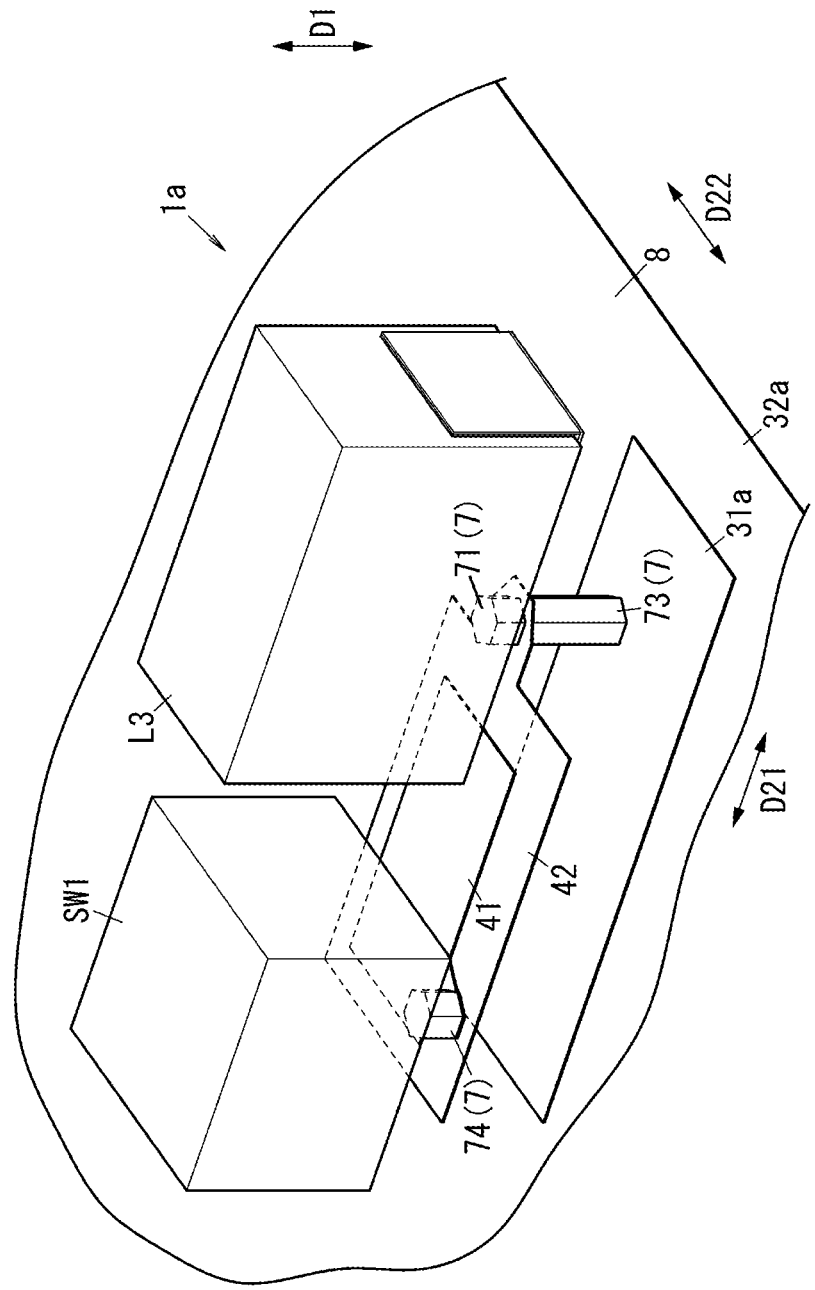
FIG. 16 is a perspective view of the principal part of the multilayer substrate.
Figure 17:
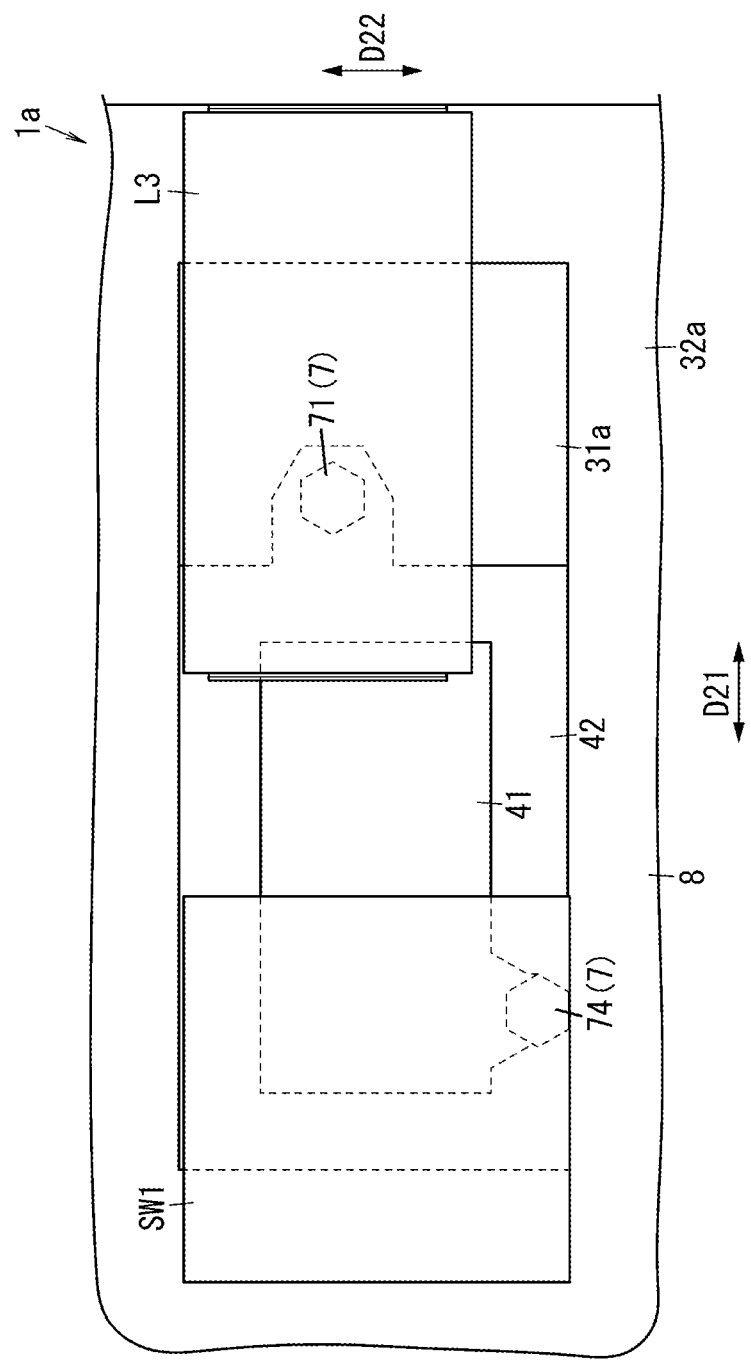
FIG. 17 is a plan view of the principal part of the multilayer substrate.
Figure 18:
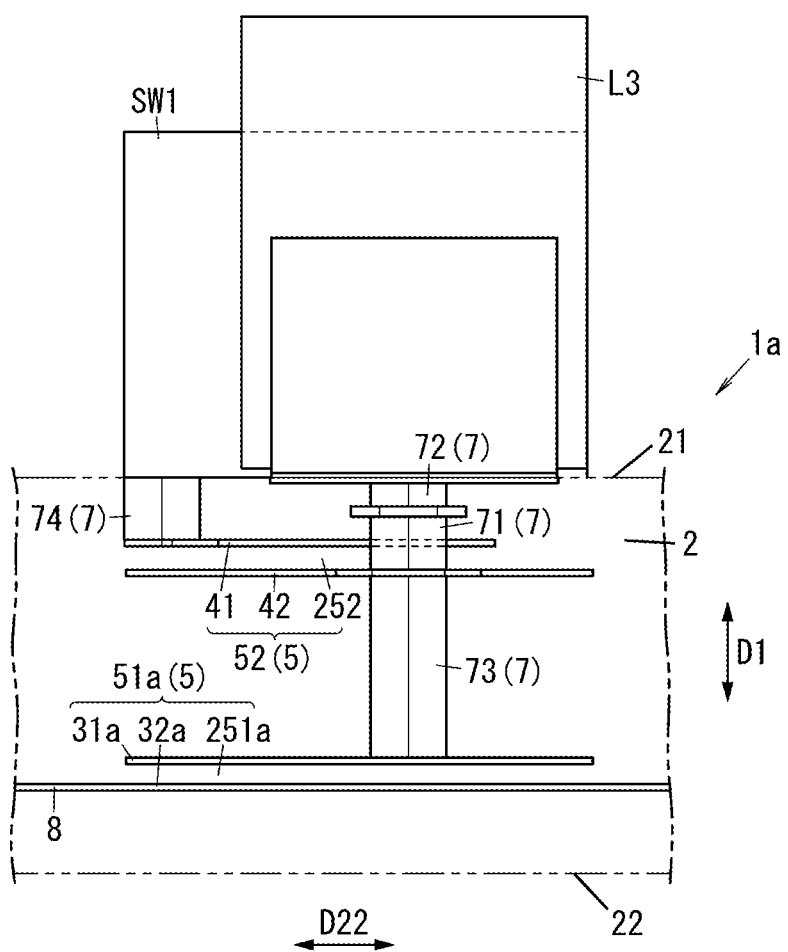
FIG. 18 is a right-hand side view of the principal part of the multilayer substrate.

A multiplexer 100c, which is a modification of Embodiment 1, may have a circuit configuration illustrated in FIG. 14.

The multiplexer 100c includes a first filter 101c, which is configured as follows. A parallel-arm capacitor C6 (a first capacitor) and a first parallel-arm inductor L4 (a first element) are connected in series to constitute a first series circuit 121. A capacitance adjustment capacitor C7 (a second capacitor) and a second parallel-arm inductor L5 (a second element) are connected in series to constitute a second series circuit 122. The first series circuit 121 and the second series circuit 122 are connected in parallel to constitute a parallel circuit 123.

The multiplexer 100c includes a second filter 102c, which is similarly configured as follows. A parallel-arm capacitor C16 (a first capacitor) and a first parallel-arm inductor L14 (a first element) are connected in series to constitute a first series circuit 124. A capacitance adjustment capacitor C17 (a second capacitor) and a second parallel-arm inductor L15 (a second element) are connected in series to constitute a second series circuit 125. The first series circuit 124 and the second series circuit 125 are connected in parallel to constitute a parallel circuit 126.

The example illustrated in FIG. 14 may also be configured as follows. As a second element, a switch (not illustrated) may replace the second parallel-arm inductor L5. In this case, the capacitance adjustment capacitor C7 (the second capacitor) and the switch (the second element) are connected in series to constitute the second series circuit 122. Similarly, as a second element, a switch (not illustrated) may replace the second parallel-arm inductor L15. In this case, the capacitance adjustment capacitor C17 (the second capacitor) and the switch (the second element) may be connected in series to constitute the second series circuit 125.

Effects that may be produced by the multilayer substrate, the multiplexer, and the radio-frequency front-end circuit according to any one of the modifications are similar to the effects produced by the multilayer substrate 1, the multiplexer 100, and the radio-frequency front-end circuit 300 according to Embodiment 1.

Embodiment 2

As illustrated in FIGS. 15 to 18, a multilayer substrate 1a according to Embodiment 2 differs from the multilayer substrate 1 (see FIGS. 1 and 2) according to Embodiment 1 in that the second capacitor electrodes 41 and 42 paired with each other entirely overlap a first capacitor electrode 31a and a first capacitor electrode 32a. Constituent elements of the multilayer substrate 1a according to Embodiment 2 that are similar to the constituent elements of the multilayer substrate 1 according to Embodiment 1 are denoted by the same reference signs, and redundant description thereof will be omitted.

As illustrated in FIGS. 15 to 18, the multilayer substrate 1a according to Embodiment 2 includes, in place of the first capacitor electrodes 31a and 32a paired with each other, the first capacitor electrodes 31 and 32 (see FIG. 1). As with the multilayer substrate 1 according to Embodiment 1, the multilayer substrate 1a also includes the dielectric substrate 2 and the second capacitor electrodes 41 and 42 paired with each other.

The first capacitor electrodes 31a and 32a paired with each other are disposed in the dielectric substrate 2 so as to face each other in the thickness direction D1 of the dielectric substrate 2. The first capacitor electrode 32a is closer than the first capacitor electrode 31a to the second main surface 22 of the dielectric substrate 2.

The first capacitor electrodes 31a and 32a paired with each other constitute a first capacitor 51a. More specifically, the first capacitor 51a includes the first capacitor electrodes 31a and 32a paired with each other and a dielectric portion 251a. The dielectric portion 251a is part of the dielectric substrate 2 and is located between the first capacitor electrodes 31a and 32a. The first capacitor electrodes 31a and 32a paired with each other in Embodiment 2 may have configurations and functions similar to those of the first capacitor electrodes 31 and 32 (see FIG. 1) in Embodiment 1, and redundant description thereof will be omitted.

The first capacitor electrode 31a is, for example, rectangular when viewed in plan in the thickness direction D1 of the dielectric substrate 2. The first capacitor electrode 32a is also used as the ground layer 8 (the ground electrode). The first capacitor electrodes 31a and 32a paired with each other in the multilayer substrate 1 are of different sizes when viewed in plan in the thickness direction D1.

The multilayer substrate 1a according to Embodiment 2 is configured as follows. When viewed in plan in the thickness direction D1 of the dielectric substrate 2, the second capacitor electrodes 41 and 42 paired with each other entirely overlap the first capacitor electrodes 31a and 32a paired with each other. More specifically, both the second capacitor electrodes 41 and 42 paired with each other are located inside the first capacitor electrode 31a when viewed in a first direction D21 and when viewed in a second direction D22. The first direction D21 and the second direction D22 are orthogonal to the thickness direction D1. That is, every part of the second capacitor electrodes 41 and 42 paired with each other overlaps the first capacitor electrode 31a when viewed in plan in the thickness direction D1.

When viewed in plan in the thickness direction D1, the second capacitor electrodes 41 and 42 paired with each other in the multilayer substrate 1a according to Embodiment 2, as mentioned above, entirely overlap the first capacitor electrodes 31a and 32a paired with each other. The stray capacitance between the ground electrode and the pair of second capacitor electrodes (the second capacitor electrodes 41 and 42 paired with each other) may be further suppressed accordingly.

Embodiment 3

As illustrated in FIG. 19, a multilayer substrate 1b according to Embodiment 3 differs from the multilayer substrate 1 (see FIG. 1) according to Embodiment 1 in that a first inductor 35 replaces the first capacitor electrodes 31 and 32 paired with each other and a second inductor 36 replaces the second capacitor electrodes 41 and 42 paired with each other. Constituent elements of the multilayer substrate 1b according to Embodiment 3 that are similar to the constituent elements of the multilayer substrate 1 according to Embodiment 1 are denoted by the same reference signs, and redundant description thereof will be omitted.

As illustrated in FIG. 19, the multilayer substrate 1b according to Embodiment 3 includes the first inductor 35 and the second inductor 36 in place of the first capacitor electrodes 31 and 32 paired with each other (see FIG. 1) and the second capacitor electrodes 41 and 42 paired with each other (see FIG. 1). As with the multilayer substrate according to Embodiment 1, the multilayer substrate 1b also includes the dielectric substrate 2.

The dielectric substrate 2 includes: a capacitor C5 (a first element) and a switch SW3 (a second element), which are in series with the first inductor 35 and the second inductor 36, respectively. More specifically, the capacitor C5 (the first element) and the switch SW3 (the second element) are disposed on the first main surface 21 of the dielectric substrate 2. The capacitor C5 and the first inductor 35 are connected in series. The switch SW3 and the second capacitor 54 are connected in series. The dielectric substrate 2 according to Embodiment 3 may have configurations and functions similar to those of the dielectric substrate 2 according to Embodiment 1 (see FIG. 1), and redundant description thereof will be omitted.

The first inductor 35 is disposed in the dielectric substrate 2. The first inductor 35 is electrically connected between the input/output electrode 6 (see FIG. 11) and the ground electrode.

The second inductor 36 is disposed in the dielectric substrate 2. The second inductor 36 and the first inductor 35 are connected in parallel.

The capacitor C5 and the switch SW3, the second inductor 36, the first inductor 35, and the ground electrode are arranged in the stated order in the thickness direction D1 of the dielectric substrate 2.

The second inductor 36 at least partially overlaps the first inductor 35 when viewed in plan in the thickness direction D1.

As with the multilayer substrate 1 according to Embodiment 1, the multilayer substrate 1b illustrated in FIG. 19 also includes a plurality of via conductors 7. Only some of the via conductors 7, or more specifically, via conductors 71b, 72b, 73b, 74b, and 79 are illustrated in FIG. 19. The via conductor 79 forms an electrical connection between the first inductor 35 and the ground layer 8. The via conductors 7 in Embodiment 3 may have configurations and functions similar to those of the via conductors 7 in Embodiment 1 (see FIG. 1), and redundant description thereof will be omitted.

The following describes a first filter and a second filter that include the multilayer substrate 1b according to Embodiment 3.

As with the first filter 101 (see FIG. 11) in Embodiment 1, the first filter in Embodiment 3 is an LC filter. Specifically, the first filter in Embodiment 3 is a T-type LC filter. As with the first filter functional unit 111 in Embodiment 1, the first filter functional unit of the first filter includes two series-arm capacitors (the first series-arm capacitor C1 and the second series-arm capacitor C2) (see FIG. 11). The first filter functional unit in Embodiment 3 also includes the capacitor C5, the first inductor 35, the second inductor 36, and the switch SW3 (see FIG. 19) in place of the parallel-arm inductor L3, the parallel-arm capacitor C3, the capacitance adjustment capacitor C4, and the switch SW1.

The capacitor C5 and the first inductor 35 are disposed on the first parallel-arm path forming a connection between the ground terminal and the node on the first series-arm path. The second inductor 36 and the switch SW3 in the first filter in Embodiment 3 constitute a series circuit connected parallel to the first inductor 35.

As with the second filter 102 (see FIG. 11) in Embodiment 1, the second filter in Embodiment 3 is an LC filter. Specifically, the second filter in Embodiment 3 is a T-type LC filter. As with the second filter functional unit 112 in Embodiment 1, the second filter functional unit of the second filter includes two series-arm capacitors (the first series-arm capacitor C11 and the second series-arm capacitor C12) (see FIG. 11) and two series-arm inductors (the first series-arm inductor L11 and the second series-arm inductor L12) (see FIG. 11). The second filter functional unit in Embodiment 3 also includes a parallel-arm capacitor, two parallel-arm inductors, and a switch in place of the parallel-arm inductor L13, the parallel-arm capacitor C13, the capacitance adjustment capacitor C14, and the switch SW2.

The parallel-arm capacitor and one of the two parallel-arm inductors are disposed on the second parallel-arm path forming a connection between the ground terminal and the node on the second series-arm path. The other parallel-arm inductor and the switch in the second filter in Embodiment 3 constitute a series circuit connected to the one parallel-arm inductor.

As mentioned above, the capacitor C5 and the switch SW3, the second inductor 36, the first inductor 35, and the ground electrode of the multilayer substrate 1b according to Embodiment 3 are arranged in the stated order in the thickness direction D1 of the dielectric substrate 2. The second inductor 36 at least partially overlaps the first inductor 35 when viewed in plan in the thickness direction D1. The stray capacitance between the second inductor 36 and the ground electrode may be suppressed accordingly.

The first and second elements in each of Embodiments 1 to 3 may be in the same position or in different positions in the thickness direction D1 of the dielectric substrate 2.

The embodiments and the modifications, which have been described so far, are merely some of the various embodiments and modifications embraced by the present disclosure. Various alterations may be made to the embodiments and modifications in accordance with, for example, designs in such a manner that the objective of the present disclosure is achieved.

CONCLUSION

As the embodiments and modifications described so far, the following aspects are herein disclosed.

In a first aspect, a multilayer substrate (1; 1a) includes an input/output electrode (6), a ground electrode (a ground layer 8), a pair of first capacitor electrodes (31, 32; 33, 34; 31a, 32a), a pair of second capacitor electrodes (41, 42; 43, 44), and a dielectric substrate (2). The input/output electrode (6) is an electrode for input, an electrode for output, or an electrode for input and output. Electrodes of the pair of first capacitor electrodes (31, 32; 33, 34; 31a, 32a) constitute a first capacitor (51; 53; 51a) electrically connected between the input/output electrode (6) and the ground electrode. Electrodes of the pair of second capacitor electrodes (41, 42; 43, 44) constitute a second capacitor (52; 54) connected parallel to the first capacitor (51; 53; 51a). A first element (a parallel-arm inductor L3; a parallel-arm inductor L13; a first parallel-arm inductor L4; a first parallel-arm inductor L14) in series with the first capacitor (51; 53; 51a) and a second element (a switch SW1; a switch SW2; a second parallel-arm inductor L5; a second parallel-arm inductor L15) in series with the second capacitor (52; 54) are disposed in or on the dielectric substrate (2). The electrodes of the pair of first capacitor electrodes (31, 32; 33, 34; 31a, 32a) are disposed in the dielectric substrate (2) so as to face each other in the thickness direction (D1) of the dielectric substrate (2). The electrodes of the pair of second capacitor electrodes (41, 42; 43, 44) are disposed in the dielectric substrate (2) so as to face each other in the thickness direction (D1). The first element and the second element that are disposed in or on the dielectric substrate (2), and the pair of second capacitor electrodes (41, 42; 43, 44), the pair of first capacitor electrodes (31, 32; 33, 34; 31a, 32a), and the ground electrode that are disposed in the dielectric substrate (2) are arranged in the stated order in the thickness direction (D1). The pair of second capacitor electrodes (41, 42; 43, 44) at least partially overlaps the pair of first capacitor electrodes (31, 32; 33, 34; 31a, 32a) when viewed in plan in the thickness direction (D1).

The multilayer substrate (1; 1a) according to the first aspect is configured as follows. The first element (the parallel-arm inductor L3; the parallel-arm inductor L13; the first parallel-arm inductor L4; the first parallel-arm inductor L14), the second element (the switch SW1; the switch SW2; the second parallel-arm inductor L5; the second parallel-arm inductor L15) that are disposed in or on the dielectric substrate (2), and the pair of second capacitor electrodes (41, 42; 43, 44), the pair of first capacitor electrodes (31, 32; 33, 34; 31a, 32a), and the ground electrode (the ground layer 8) that are disposed in the dielectric substrate (2) are arranged in the stated order in the thickness direction (D1). The pair of second capacitor electrodes (41, 42; 43, 44) at least partially overlaps the pair of first capacitor electrodes (31, 32; 33, 34; 31a, 32a) when viewed in plan in the thickness direction (D1). Stray capacitance between the pair of second capacitor electrodes (41, 42; 43, 44) and ground electrode may be suppressed accordingly.

In a second aspect, the multilayer substrate (1; 1a) according to the first aspect is configured as follows. The second capacitor (52; 54) and the second element (the switch SW1; the switch SW2) are connected in series to constitute a series circuit (115; 117). The first capacitor (51; 53; 51a) and the series circuit (115; 117) are connected in parallel to constitute a parallel circuit (116; 118). The first element (the parallel-arm inductor L3; the parallel-arm inductor L13) and the parallel circuit (116; 118) are connected in series. The second element is electrically connected between the second capacitor (52; 54) and the ground electrode (the ground layer 8).

In a third aspect, the multilayer substrate (1; 1a) according to the first or second aspect is configured as follows. One electrode (42) closer than the other electrode of the pair of second capacitor electrodes (41, 42) to the first capacitor (51; 51a) at least partially overlaps one electrode (31; 33; 31a) closer than the other electrode of the pair of first capacitor electrodes (31, 32; 33, 34; 31a, 32a) to the second capacitor (52) when viewed in plan in the thickness direction (D1).

In a fourth aspect, the multilayer substrate (1; 1a) according to any one of the first to third aspects is configured as follows. One electrode (42; 44) closer than the other electrode of the pair of second capacitor electrodes (41, 42; 43, 44) to the first capacitor (51; 51a) has an area greater than the area of the other electrode (41; 43) farther than the one electrode of the pair of second capacitor electrodes (41, 42; 43, 44) from the first capacitor (51; 51a) and at least partially overlaps one electrode (32; 34; 32a) farther than the other electrode of the pair of first capacitor electrodes (31, 32; 33, 34; 31a, 32a) from the second capacitor (52; 54) when viewed in plan in the thickness direction (D1).

In a fifth aspect, the multilayer substrate (1a) according to any one of the first to fourth aspects is configured as follows. The pair of second capacitor electrodes (41, 42) entirely overlaps the pair of first capacitor electrodes (31a, 32a) when viewed in plan in the thickness direction (D1).

In the multilayer substrate (1a) according to the fifth aspect, the pair of second capacitor electrodes (41, 42) entirely overlaps the pair of first capacitor electrodes (31a, 32a) when viewed in plan in the thickness direction (D1). The stray capacitance between the pair of second capacitor electrodes (41, 42) and the ground electrode (ground layer 8) may be further suppressed accordingly.

In a sixth aspect, the multilayer substrate (1; 1a) according to any one of the first to fifth aspects further includes a connection path portion (via conductors 71, 72; via conductors 75, 76). The connection path portion is disposed in the dielectric substrate (2) to form an electrical connection between the first element (the parallel-arm inductor L3; the parallel-arm inductor L13) and the second capacitor (52; 54). The connection path portion overlaps the first capacitor (51; 53; 51a) when viewed in plan in the thickness direction (D1).

In a seventh aspect, the multilayer substrate (1; 1a) according to any one of the first to sixth aspects is configured as follows. One electrode (32; 34; 32a) farther than the other electrode of the pair of first capacitor electrodes (31, 32; 33, 34; 31a, 32a) from the second capacitor (52; 54) is also used as the ground electrode (the ground layer 8).

In the multilayer substrate (1; 1a) according to the seventh aspect, the first capacitor electrode (32; 34; 32a) farther from the second capacitor (52; 54) is also used as the ground electrode (the ground layer 8). The ground may thus be close to ideal.

In an eighth aspect, the multilayer substrate (1; 1a) according to any one of the first to seventh aspects is configured as follows. The first element is an inductor (the parallel-arm inductor L3; L13). The second element is a switch (SW1; SW2).

In a ninth aspect, a multilayer substrate (1b) includes an input/output electrode (6), a ground electrode (a ground layer 8), a first inductor (35), a second inductor (36), and a dielectric substrate (2). The input/output electrode (6) is an electrode for input, an electrode for output, or an electrode for input and output. The first inductor (35) is electrically connected between the input/output electrode (6) and the ground electrode. The second inductor (36) is connected parallel to the first inductor (35). A first element (a capacitor C5) and a second element (a switch SW3) are disposed in or on the dielectric substrate (2). The first element and the first inductor (35) are connected in series. The second element and the second inductor (36) are connected in series. The first inductor (35) is disposed in the dielectric substrate (2). The second inductor (36) is disposed in the dielectric substrate (2). The first element and the second element that are disposed in or on the dielectric substrate (2), and the second inductor (36), the first inductor (35), and the ground electrode that are disposed in the dielectric substrate (2) are arranged in the stated order in a thickness direction (D1) of the dielectric substrate (2). The second inductor (36) at least partially overlaps the first inductor (35) when viewed in plan in the thickness direction (D1).

The multilayer substrate (1b) according to the ninth aspect is configured as follows. The first element (the capacitor C5) and the second element (the switch SW3) that are disposed in or on the dielectric substrate (2), and the second inductor (36), the first inductor (35), and the ground electrode (ground layer 8) that are disposed in the dielectric substrate (2) are arranged in the stated order in the thickness direction (D1). The second inductor (36) at least partially overlaps the first inductor (35) when viewed in plan in the thickness direction (D1). Stray capacitance between the second inductor (36) and the ground electrode may be suppressed accordingly.

In a tenth aspect, a low-pass filter (a second filter 102) includes the multilayer substrate (1; 1a; 1b) according to any one of the first to ninth aspects, a pass band of the low-pass filter being lower than or equal to a predetermined frequency.

Stray capacitance in the multilayer substrate (1; 1a; 1b) of the low-pass filter (the second filter 102) according to the tenth aspect may be suppressed.

In an eleventh aspect, a high-pass filter (a first filter 101) includes the multilayer substrate (1; 1a; 1b) according to any one of the first to ninth aspects, a pass band of the high-pass filter being higher than or equal to a predetermined frequency.

Stray capacitance in the multilayer substrate (1; 1a; 1b) of the high-pass filter (first filter 101) according to the eleventh aspect may be suppressed.

In a twelfth aspect, a multiplexer (100; 100a) includes the multilayer substrate (1; 1a; 1b) according to any one of the first to ninth aspects. The multilayer substrate (1; 1a; 1b) includes a plurality of the input/output electrodes (6) and further includes a first series-arm capacitor (C1; C11) and a second series-arm capacitor (C2; C12). The plurality of input/output electrodes (6) include: an antenna-side terminal (T0) connected to an antenna (200); and a first terminal (T1) and a second terminal (T2) that are different from the antenna-side terminal (T0). The first series-arm capacitor (C1) and the second series-arm capacitor (C2) are disposed on a path (a first series-arm path r11) forming a connection between the antenna-side terminal (T0) and the first terminal (T1) and is connected to the first terminal (T1) so as to be part of a first filter (101). The first series-arm capacitor (C11) and the second series-arm capacitor (C12) are disposed on a path (a second series-arm path r21) forming a connection between the antenna-side terminal (T0) and the second terminal (T2) and is connected to the second terminal (T2) so as to be part of a second filter (102).

Stray capacitance in the multilayer substrate (1; 1a; 1b) of the multiplexer (100; 100a) according to the twelfth aspect may be suppressed.

In a thirteenth aspect, a radio-frequency front-end circuit (300) includes: the multiplexer (100; 100a) according to the twelfth aspect; and a (first) amplifier circuit (303) connected to the multiplexer (100; 100a).

Stray capacitance in the multilayer substrate (1; 1a; 1b) included in the radio-frequency front-end circuit (300) according to the thirteenth aspect may be suppressed.

In a fourteenth aspect, a communication device (400) includes the radio-frequency front-end circuit (300) according to the thirteenth aspect and an RF signal processing circuit (401) that processes radio-frequency signals received through the antenna (200). The radio-frequency front-end circuit (300) transmits the radio-frequency signals between the antenna (200) and the RF signal processing circuit (401).

Stray capacitance in multilayer substrate (1; 1a; 1b) included in the communication device (400) according to the fourteenth aspect may be suppressed.

1, 1a, 1b multilayer substrate
2 dielectric substrate
31, 32, 31a, 32a, 33, 34 first capacitor electrode
35 first inductor
36 second inductor
41, 42, 43, 44 second capacitor electrode
51, 51a, 53 first capacitor
52, 54 second capacitor
6 input/output electrode
7, 71 to 79, 71b to 74b via conductor (connection path portion)
8 ground layer (ground electrode)
100, 100a, 100c multiplexer
101 first filter (high-pass filter)
102 second filter (low-pass filter)
300, 300b radio-frequency front-end circuit
400 communication device
401 RF signal processing circuit
T0 antenna-side terminal
T1 first terminal
T2 second terminal
C1, C11 first series-arm capacitor
C2, C12 second series-arm capacitor
C3, C13, C6, C16 parallel-arm capacitor (first capacitor)
C4, C14, C7, C17 capacitance adjustment capacitor (second capacitor)
C5 capacitor (first element)
L3, L13 parallel-arm inductor (first element)
L4, L14 first parallel-arm inductor (first element)
L5, L15 second parallel-arm inductor (second element)
SW1, SW2, SW3 switch (second element)
D1 thickness direction

The invention claimed is:

1. A multilayer substrate, comprising:
an input/output electrode configured to receive an input signal, to output an output signal, or to receive the input signal and to output the output signal;
a ground electrode;
a first capacitor comprising a pair of first capacitor electrodes, the first capacitor being electrically connected between the input/output electrode and the ground electrode;
a second capacitor comprising a pair of second capacitor electrodes, the second capacitor being connected in parallel to the first capacitor; and
a dielectric substrate in or on which a first circuit element and a second circuit element are located, the first circuit element being in series with the first capacitor and the second circuit element being in series with the second capacitor, wherein:
the pair of first capacitor electrodes are located in the dielectric substrate so as to face each other in a thickness direction of the dielectric substrate,
the pair of second capacitor electrodes are located in the dielectric substrate so as to face each other in the thickness direction,
in the thickness direction, the first circuit element and the second circuit element are above the pair of second capacitor electrodes, the pair of second capacitor electrodes are above the pair of first capacitor electrodes, and the pair of first capacitor electrodes are above the ground electrode,
as seen in a plan view of the dielectric substrate along the thickness direction, the pair of second capacitor electrodes at least partially overlaps the pair of first capacitor electrodes, and
the electrode of the pair of second capacitor electrodes that is closest to the first capacitor:
has an area greater than an area of the electrode of the pair of second capacitor electrodes that is farthest from the first capacitor, and
as seen in the plan view, at least partially overlaps the electrode of the pair of first capacitor electrodes that is farthest from the second capacitor.

2. The multilayer substrate according to claim 1, wherein:
a series circuit comprises the second capacitor and the second circuit element connected in series,
a parallel circuit comprises the first capacitor and the series circuit connected in parallel,
the first circuit element and the parallel circuit are connected in series, and
the second circuit element is electrically connected between the second capacitor and the ground electrode.

3. The multilayer substrate according to claim 1, wherein, as seen in the plan view, the pair of second capacitor electrodes entirely overlaps the pair of first capacitor electrodes.

4. The multilayer substrate according to claim 1, wherein:
the first circuit element is an inductor, and
the second circuit element is a switch.

5. A low-pass filter, comprising the multilayer substrate according to claim 1, wherein a pass band of the low-pass filter is less than or equal to a predetermined frequency.

6. A high-pass filter, comprising the multilayer substrate according to claim 1, wherein a pass band of the high-pass filter is greater than or equal to a predetermined frequency.

7. A multiplexer, comprising the multilayer substrate according to claim 1, wherein:
the multilayer substrate comprises a plurality of the input/output electrodes and further comprises:
a first series-arm capacitor, and
a second series-arm capacitor,
the plurality of input/output electrodes comprise:
an antenna-side terminal connected to an antenna, and
a first terminal and a second terminal that are different from the antenna-side terminal,
the first series-arm capacitor is on a first path that connects the antenna-side terminal to the first terminal, and is part of a first filter, and
the second series-arm capacitor is on a second path that connects the antenna-side terminal to the second terminal, and is part of a second filter.

8. A radio-frequency front-end circuit, comprising:
the multiplexer according to claim 7; and
an amplifier circuit connected to the multiplexer.

9. A communication device, comprising:
the radio-frequency front-end circuit according to claim 8; and
a radio frequency (RF) signal processing circuit configured to process radio-frequency signals received through the antenna,
wherein the radio-frequency front-end circuit is configured to transmit the radio-frequency signals between the antenna and the RF signal processing circuit.

10. A multilayer substrate comprising:
an input/output electrode configured to receive an input signal, to output an output signal, or to receive the input signal and to output the output signal;
a ground electrode;
a first capacitor comprising a pair of first capacitor electrodes, the first capacitor being electrically connected between the input/output electrode and the ground electrode;
a second capacitor comprising a pair of second capacitor electrodes, the second capacitor being connected in parallel to the first capacitor; and
a dielectric substrate in or on which a first circuit element and a second circuit element are located, the first circuit element being in series with the first capacitor and the second circuit element being in series with the second capacitor, wherein:
the pair of first capacitor electrodes are located in the dielectric substrate so as to face each other in a thickness direction of the dielectric substrate,
the pair of second capacitor electrodes are located in the dielectric substrate so as to face each other in the thickness direction,
in the thickness direction, the first circuit element and the second circuit element are above the pair of second capacitor electrodes, the pair of second capacitor electrodes are above the pair of first capacitor electrodes, and the pair of first capacitor electrodes are above the ground electrode,
as seen in a plan view of the dielectric substrate along the thickness direction, the pair of second capacitor electrodes at least partially overlaps the pair of first capacitor electrodes, and
a connection path in the dielectric substrate that electrically connects the first circuit element and the second capacitor,
wherein, as seen in the plan view, the connection path overlaps the first capacitor.

11. A multilayer substrate comprising:
an input/output electrode configured to receive an input signal, to output an output signal, or to receive the input signal and to output the output signal;
a ground electrode;
a first capacitor comprising a pair of first capacitor electrodes, the first capacitor being electrically connected between the input/output electrode and the ground electrode;
a second capacitor comprising a pair of second capacitor electrodes, the second capacitor being connected in parallel to the first capacitor; and
a dielectric substrate in or on which a first circuit element and a second circuit element are located, the first circuit element being in series with the first capacitor and the second circuit element being in series with the second capacitor, wherein:
the pair of first capacitor electrodes are located in the dielectric substrate so as to face each other in a thickness direction of the dielectric substrate,
the pair of second capacitor electrodes are located in the dielectric substrate so as to face each other in the thickness direction,
in the thickness direction, the first circuit element and the second circuit element are above the pair of second capacitor electrodes, the pair of second capacitor electrodes are above the pair of first capacitor electrodes, and the pair of first capacitor electrodes are above the ground electrode, and
as seen in a plan view of the dielectric substrate along the thickness direction, the pair of second capacitor electrodes at least partially overlaps the pair of first capacitor electrodes,
wherein the electrode of the pair of first capacitor electrodes that is farthest from the second capacitor is also the ground electrode.

\* \* \* \* \*